United States Patent
Veloso et al.

(10) Patent No.: US 11,201,093 B2
(45) Date of Patent: Dec. 14, 2021

(54) METHOD OF MANUFACTURING A SEMICONDUCTOR DEVICE INCLUDING THE HORIZONTAL CHANNEL FET AND THE VERTICAL CHANNEL FET

(71) Applicant: IMEC vzw, Leuven (BE)

(72) Inventors: Anabela Veloso, Leuven (BE); Trong Huynh Bao, Leuven (BE); Julien Ryckaert, Schaerbeek (BE); Raf Appeltans, Haasrode (BE)

(73) Assignee: IMEC vzw, Leuven (BE)

( * ) Notice: Subject to any disclaimer, the term of this patent is extended or adjusted under 35 U.S.C. 154(b) by 67 days.

(21) Appl. No.: 16/836,653

(22) Filed: Mar. 31, 2020

(65) Prior Publication Data

US 2020/0312726 A1    Oct. 1, 2020

(30) Foreign Application Priority Data

Apr. 1, 2019  (EP) .................... 19166579

(51) Int. Cl.
  *H01L 21/8234*  (2006.01)
  *H01L 27/088*  (2006.01)

(52) U.S. Cl.
  CPC .......... *H01L 21/823487* (2013.01); *H01L 21/823431* (2013.01); *H01L 21/823456* (2013.01); *H01L 27/0886* (2013.01)

(58) Field of Classification Search
  CPC ..... H01L 21/823431; H01L 21/823437; H01L 21/823456; H01L 21/823487; H01L 21/823821; H01L 21/823885; H01L 21/845
  See application file for complete search history.

(56) References Cited

U.S. PATENT DOCUMENTS

| | | |
|---|---|---|
| 9,502,407 B1 | 11/2016 | Anderson et al. |
| 9,607,899 B1 | 3/2017 | Cheng et al. |
| 9,741,716 B1 | 8/2017 | Cheng et al. |
| 9,870,952 B1 | 1/2018 | Cheung et al. |
| 10,170,473 B1 | 1/2019 | Zang et al. |
| 2004/0159853 A1 | 8/2004 | Nemati et al. |
| 2010/0203595 A1 | 8/2010 | Oh et al. |
| 2012/0319201 A1 | 12/2012 | Sun et al. |

(Continued)

OTHER PUBLICATIONS

Extended European Search Report (EESR) for EP Application No. 19166579.3 dated Oct. 22, 2019.

*Primary Examiner* — Hoai V Pham
(74) *Attorney, Agent, or Firm* — Knobbe, Martens, Olson & Bear, LLP

(57) ABSTRACT

A method of fabricating a semiconductor device is disclosed. In one aspect, the method includes forming, in a vertical channel field-effect transistor (FET) device region, a vertical channel FET device including a first semiconductor structure including a lower source/drain portion, an upper source/drain portion, a first channel portion extending vertically and intermediate the source/drain portions and a gate structure extending along the channel portion and, in a horizontal channel FET device region, a horizontal channel FET device comprising a second semiconductor structure including a first source/drain portion, a second source/drain portion, a second channel portion extending horizontally and intermediate the source/drain portions, and a gate structure extending across the channel portion.

19 Claims, 14 Drawing Sheets

(56) References Cited

U.S. PATENT DOCUMENTS

| | | |
|---|---|---|
| 2016/0293757 A1 | 10/2016 | Xie et al. |
| 2017/0287900 A1 | 10/2017 | Balakrishnan et al. |
| 2018/0226402 A1 | 8/2018 | Xie et al. |
| 2018/0337278 A1 | 11/2018 | Chi et al. |
| 2019/0214307 A1* | 7/2019 | Xie .................... H01L 29/7827 |

* cited by examiner

METHOD OF MANUFACTURING A SEMICONDUCTOR DEVICE INCLUDING THE HORIZONTAL CHANNEL FET AND THE VERTICAL CHANNEL FET

CROSS-REFERENCE TO RELATED APPLICATIONS

This application claims foreign priority to European Application No. EP 19166579.3, filed Apr. 1, 2019, the content of which is incorporated by reference herein in its entirety.

BACKGROUND

Technological Field

The disclosed technology generally relates to the field of semiconductor devices, and more particularly to semiconductor devices including non-planar semiconductor devices such as field-effect transistors (FETs) and methods of manufacturing the same.

Description of the Related Technology

Consumers increasingly demand power-efficient and area-efficient circuit designs. Some of the consumer demands may be addressed with continued physical scaling of the semiconductor devices and increase in the density of semiconductor devices. In some semiconductor devices, e.g., two-dimensional (2D) or planar semiconductor devices, the integration of the device mainly corresponds to the lateral dimensions of the area occupied by a unit cell of the device. With continued scaling to achieve increasingly smaller devices, however, such lateral scaling may eventually become impractical or insufficient to meet the technological needs. This may be because, among other reasons, as technological node advances, smaller sizes may be achieved at the expense of increasing difficulty and/or cost. To overcome the potential roadblock for continued increase in the device density, non-planar field-effect transistor (FET) devices have been developed.

Two types of non-planar field-effect transistor (FET) devices are the horizontal channel FET devices and the vertical channel FET devices. Horizontal channel FET (HFET) devices include, for example, finFET devices having a gate straddling a channel portion of a fin-shaped semiconductor structure, and the horizontal nanowire-FET devices or nanosheet-FET devices having a gate at least partly enclosing a channel portion of a horizontally oriented nanowire-shaped or nanosheet-shaped semiconductor structure. Vertical channel FET (VFET) devices include, for example, vertical nanowire-FET devices or nanosheet-FET devices having a gate at least partly enclosing a channel portion of a vertically oriented nanowire or nanosheet semiconductor structure. There are notable challenges associated with fabricating VFET devices and HFET devices.

SUMMARY OF CERTAIN INVENTIVE ASPECTS

A sequential approach duplicates similar process steps, first in a horizontal channel field-effect transistor (FET) device region and then in a vertical channel FET device region, or vice versa. This however adds to the overall costs and complexity of the process and hence inhibits large scale fabrication of devise including both horizontal channel FET devices and vertical channel FET devices. Therefore, it would be advantageous to develop processing schemes which allow at least some of the device fabrication steps to be applied simultaneously in both the horizontal FET device region and vertical channel FET device region.

An objective of the present disclosed technology is therefore to provide a method allowing co-integration of vertical channel FET devices and horizontal channel FET devices on a same substrate with an improved process-efficiency and cost-efficiency.

According to an aspect of the disclosed technology there is provided a method for forming a semiconductor device, the method including: forming, in a vertical channel FET device region of a semiconductor substrate, a vertical channel field-effect transistor FET device including a first semiconductor structure which may include a lower source/drain portion, an upper source/drain portion, a first channel portion extending vertically and between the lower source/drain portion and the upper source/drain portion, and a first gate structure extending along the first channel portion; forming, in a horizontal channel FET device region of the substrate, a horizontal channel FET device including a second semiconductor structure including first source/drain portion, a second source/drain portion, a second channel portion extending horizontally and between the first source/drain portion and the second source/drain portion, and a second gate structure extending across the second channel portion; where forming the vertical channel FET device and the horizontal channel FET device includes: prior to forming the first gate structure and the second gate structure, forming: in the vertical channel FET device region, a first sacrificial or dummy gate extending along the first semiconductor structure; and in the horizontal channel FET device region, a second sacrificial or dummy gate across the horizontal semiconductor structure; recessing the first sacrificial or dummy gate of the vertical channel FET device region to define a gate length for the vertical channel FET device; embedding the first and second semiconductor structures in a dielectric layer having a height exposing an upper surface of the sacrificial or dummy gate in the horizontal channel FET device region; forming a trench in the dielectric layer to expose the first sacrificial or dummy gate of the vertical channel FET device region; simultaneously replacing the first sacrificial or dummy gate of the vertical channel FET device region and the second sacrificial or dummy gate of the horizontal channel FET device region with the gate structures.

It has been discovered that an underlying impediment to parallel or simultaneous processing in the horizontal FET device region and the vertical channel FET device region stems from the different geometries and compositions of the two types of FETs. A major difference between the vertical channel FET (VFET) device and the horizontal channel FET (HFET) device relates to the definition and orientation of the gate structures. Due the vertical channel orientation of the VFET, the gate/channel length is not defined by the linewidth of the gate but rather by the vertical dimension/thickness of the gate. This calls for an integrated process capable of providing a well-controlled alignment and patterning in both the vertical and the horizontal direction.

According to the disclosed technology, the sacrificial or dummy gate of the vertical channel FET (VFET) device region may be etched back to a thickness corresponding to the gate length of the VFET device. This may be done selectively with respect to the sacrificial or dummy gate of the horizontal channel FET (HFET) device region, which may be protected by an etch mask during the etching. Hence, by selectively recessing the gate structure in the VFET region, the gate length may be defined independently from the gate length in the HFET region. As a result, the sacrificial or dummy gates of the VFET and HFET regions are provided with a shape and extension that allow them to be replaced with the final gate structures in a replacement process applied simultaneously in the VFET region and the HFET region.

Subsequent to forming the final gate structures in the replacement process, the method may proceed with further process steps to complete forming of the vertical FET device and horizontal FET device in their respective regions.

A horizontal channel FET device may be a device including a semiconductor structure including a first source/drain portion, a second source/drain portion and a channel portion located intermediate and extending horizontally between the first source/drain portion and second source/drain portion, and further including a gate structure extending horizontally along the channel portion. In a horizontal channel FET device, the first source/drain portion and second source/drain portion and the channel portion intersect a common horizontal plane. The channel portion is adapted to, when integrated within a device, conduct a horizontally oriented flow of charge carriers between the first source/drain portion and the second source/drain portion.

A vertical channel FET device may be a device including a semiconductor structure including a lower source/drain portion, an upper source/drain portion, and a channel portion located intermediate and extending vertically between the lower source/drain portion and upper source/drain portion, and further including a gate structure extending vertically along the channel portion. The gate structure may at least partially enclose the channel portion. In particular, the gate structure may wrap-around the channel portion, e.g., a gate-all-around (GAA) structure. The lower source/drain portion, upper source/drain portion, and the channel portion may intersect a common vertical plane. The channel portion is adapted to, when integrated within a device, conduct a vertically flow of charge carriers between the upper source/drain portion and the lower source/drain portion.

As used herein, the term "vertical" denotes a direction or orientation (e.g., of a surface, a dimension or other feature) parallel to a normal to the substrate (e.g., a main plane of extension or main/upper surface thereof). The term "horizontal" meanwhile denotes a direction or orientation substantially parallel to the substrate (e.g., a main plane of extension or main surface thereof), or equivalently transverse to the vertical direction. Meanwhile, terms such as "above", "upper", "top" and "below", "lower", "bottom" refer to relative positions as viewed along the vertical direction, and does hence not imply an absolute orientation of the substrate or device.

According to an embodiment, the sacrificial or dummy gates may be formed on an isolating layer embedding a respective bottom portion of the first and second semiconductor structures. The gate structures may hence be separated and insulated from the semiconductor substrate. Further, an upper surface of the sacrificial or dummy gates may extend at a vertical level below the channel portion of the first semiconductor structure. The upper surface of the sacrificial or dummy gates may extend at a vertical level below an edge of the first channel portion of the first semiconductor structure. By the upper surface of the insulating layer extending at a level below the intermediate layer portion, the entire intermediate layer portion may be exposed, wherein the first gate structure may be formed to extend along the entire length thereof. Additionally, an upper section of the lower layer portion may be exposed, which allows selective spacer formation thereon, as will be discussed in more detail below.

According to an embodiment, upper surfaces of the sacrificial or dummy gates, prior to the recessing, may be located at corresponding vertical levels in the vertical channel FET device region and in the horizontal channel FET device region. This allows the gate structures to be formed in parallel in the VFET region and the HFET region, e.g., by simultaneously depositing materials with a same thickness in the regions.

According to an embodiment, forming the sacrificial or dummy gates may include simultaneously patterning a sacrificial or dummy gate layer in the vertical channel FET device region and in the horizontal channel FET device region. Accordingly, the gate structures may be formed in a parallel and efficient manner in the VFET and HFET regions by a common gate layer deposition and subsequent gate layer patterning. The patterning may be followed by the above-disclosed recessing of the first gate structure to define the gate length for the vertical channel FET device.

According to an embodiment, the sacrificial or dummy gate in the vertical channel FET device region may be arranged to wrap around the channel portion. Thus, the VFET device may be a gate-all-around FET device.

According to an embodiment, replacing the sacrificial or dummy gates with the gate structures may include simultaneously removing the sacrificial or dummy gates by etching, and simultaneously depositing a gate stack extending along the channel portion of the first semiconductor structure, and a gate stack extending across the channel portion of the second semiconductor structure. A replacement metal-gate, RMG, module may hence be applied in parallel in the VFET and HFET regions.

According to an embodiment, the method may further include recessing the gate stack deposited in the trench in the vertical channel FET device region, preferably such that the trench can be refilled with an insulating material to leave room for electrical contact structures, such as a top electrode, for accessing the source/drain portions.

According to an embodiment, spacers may be formed on peripheral surfaces of the source/drain portions of the first semiconductor structure prior to forming the sacrificial or dummy gate. The spacers may be employed to facilitate the gate to be aligned vertically, in an accurate manner, with respect to the channel portion. By forming the gate structure to extend along the full height (e.g., thickness) of the intermediate channel portion, the gate length may accordingly be defined to match the height of the channel portion. The spacer may separate a gate electrode of the first gate structure from the lower and upper source/drain portions.

A selective or at least preferential forming of the spacers may be employed. According to an embodiment, the forming of the spacers may include subjecting the first semiconductor structure to an oxidation process, thereby forming an oxide layer on the peripheral surfaces of the source/drain portions and on peripheral surface of the channel portion. The oxidation process may be configured such that the source/drain portions are provided with thicker oxide layer portions than the channel portion. A thickness of the spacer thus formed may accordingly be controlled via the duration of the oxidation process.

According to an embodiment, the forming of the spacers may further include etching the oxide layer to expose the channel portion while preserving at least some of the oxide layer portions at the source/drain portions. The etching may for example be employed in case the oxide layer portion formed at the channel portion is too thick to not have a negative impact on the performance the resulting VFET device. In that case, the etching may be applied for a duration that is sufficiently long to ensure removal or at sufficient thinning of the oxide layer portion at the channel portion, and short enough to ensure that sufficiently thick spacers remain at the source/drain portions.

The channel portion may be formed from an intermediate layer of a material being different from materials of upper/lower layers from which the source/drain portions of the first semiconductor structure may be formed. Advantageously, the materials may be selected so as to provide a contrast in oxidation rate during the forming of the spacers as mentioned above.

According to an embodiment, the upper source/drain portion may comprise $Si_{1-x}Ge_x$, the channel portion comprise $Si_{1-y}Ge_y$, and the lower source/drain portion comprise $Si_{1-z}Ge_z$, wherein 0<x, z≤1 and 0≤y<x, z. Accordingly, the lower, intermediate and upper layers may be Si-comprising layers wherein at least the lower and upper layers further comprise Ge, the Ge-content being greater than the intermediate layer.

Especially, the intermediate layer may be a substantially Si-layer and the lower and upper layers may be SiGe-layers (e.g., with a non-zero Ge-content), preferably in the range or 10 to 90%, more preferably about 20 to 30%.

The different material compositions in the channel portion and the source/drain portions may be employed in an oxidization process for selective or at least preferential forming of the gate alignment spacer on the source/drain portions.

According to an embodiment, the method may further include, prior to forming the vertical channel FET device and the horizontal channel FET device, providing the semiconductor substrate. The providing of the semiconductor substrate may include: in the vertical channel FET device region, providing a first layer structure including, in the following order, a lower semiconductor layer for the lower source/drain portion, an intermediate semiconductor layer for the channel portion, and an upper semiconductor layer for the upper source/drain portion, and in the horizontal channel FET device region, providing a second layer structure comprising at least one semiconductor layer, wherein a surface of the substrate in the vertical channel FET device region is coplanar with a surface of the substrate in the horizontal channel FET device region. Providing the semiconductor substrate may further comprise: forming a mask defining a first semiconductor structure mask portion above the vertical channel FET device region and a second semiconductor structure mask portion above the horizontal channel FET device region; and patterning the first layer structure and the second layer structure by simultaneously etching the first layer structure and the second layer structure while using the mask as an etch mask, thereby forming: the first semiconductor structure for the vertical channel FET device in the vertical channel FET device region, and the second semiconductor structure for the horizontal channel FET device in the horizontal channel FET device region.

Accordingly, there is provided a semiconductor substrate comprising first and second layer structures of different compositions in the VFET region and the HFET region, respectively. The present embodiment allows for the first and second layer structures to be individually tailored for the horizontal and vertical channel FET device, respectively.

Meanwhile, since the respective surfaces of the VFET and HFET regions are co-planar, the respective surfaces may together define a common planar substrate surface. This in turn allows the first and second layer structures to be simultaneously patterned using a common etch mask, despite their different compositions.

According to an embodiment, the simultaneous etching includes etching back exposed surface portions of the first and second layer structures to corresponding vertical levels, such that the first and second semiconductor structures present corresponding heights above said common vertical level.

This may further simplify subsequent processing steps of device formation in that both the upper surfaces of the VFET and HFET regions (defined by the upper surfaces of the first and semiconductor structures) will be located at corresponding levels and the bottom (etched-back) surfaces of the VFET and HFET regions (adjacent to the first and second semiconductor structures) will be located at corresponding levels. The exposed surface portions of the first and second layer structures here refer to the horizontally oriented surface portions exposed by the etch mask.

According to an embodiment, providing the first layer structure in the vertical channel FET device region may include: recessing the substrate in the vertical channel FET device region, and subsequently epitaxially growing the first layer structure comprising the lower, intermediate and upper semiconductor layers such that an upper surface of the first layer structure becomes coplanar with the surface of the substrate in the horizontal channel FET device region.

This approach is especially advantageous in case the second layer structure in the HFET region consists of a single semiconductor layer. The vertical space required for the first layer structure may conveniently be provided by recessing the substrate by a corresponding vertical distance.

According to an embodiment, the method may further include, prior to growing the first layer structure, forming an insulating layer on a sidewall of the substrate formed during said recessing of the substrate. An electrical insulation may thereby be provided between the VFET region and the HFET region.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

The disclosed technology relates to a method of forming field-effect transistor (FET) devices and more specifically relates to an integrated approach to forming vertical channel FET devices and horizontal channel FET devices. Process flows to fabrication either HFET devices or VFET devices have been developed. However, due to the different designs of the horizontal FET devices and vertical FET devices, fabrication of horizontal channel FET devices and vertical channel FET devices on a common substrate remains a challenge. Although fabrication of horizontal channel FET devices and vertical channel FET devices may involve corresponding process steps, such as patterning horizontal or vertical semiconductor structures (e.g., for gate formation or source/drain definition) for the respective FET devices, the design differences between the device types have led previous co-integration of horizontal and vertical channel FET devices on a common substrate to be a purely sequential approach, where the process steps for horizontal and vertical channel FET device fabrication are performed in a staggered fashion.

A method for forming a semiconductor device will now be described with reference to the figures. Reference will throughout be made to a vertical channel field-effect transistor (FET) device region (VFET region) 10 and a horizontal channel FET device region (HFET region) 20 of a semiconductor substrate 100, The VFET device region 10 is a region for supporting VFET devices. The HFET region 20 is a region for supporting HFET devices.

Figure 4:
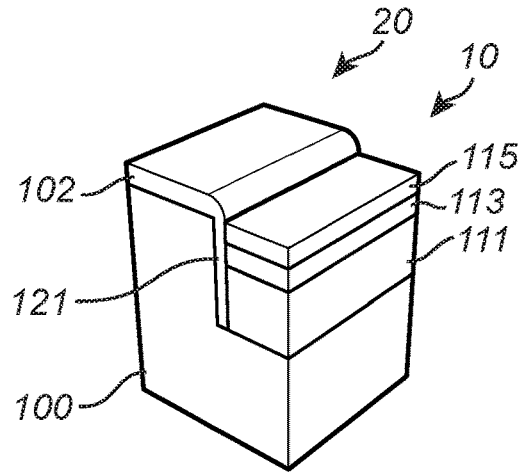
Figure 5:
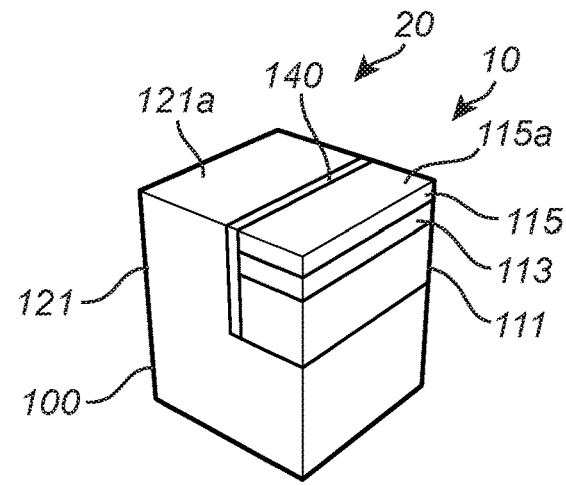
Figure 6:
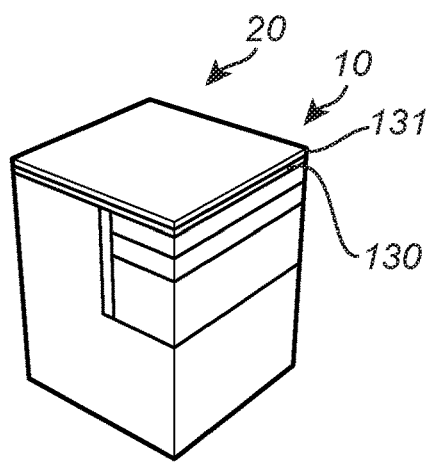
Figure 7:
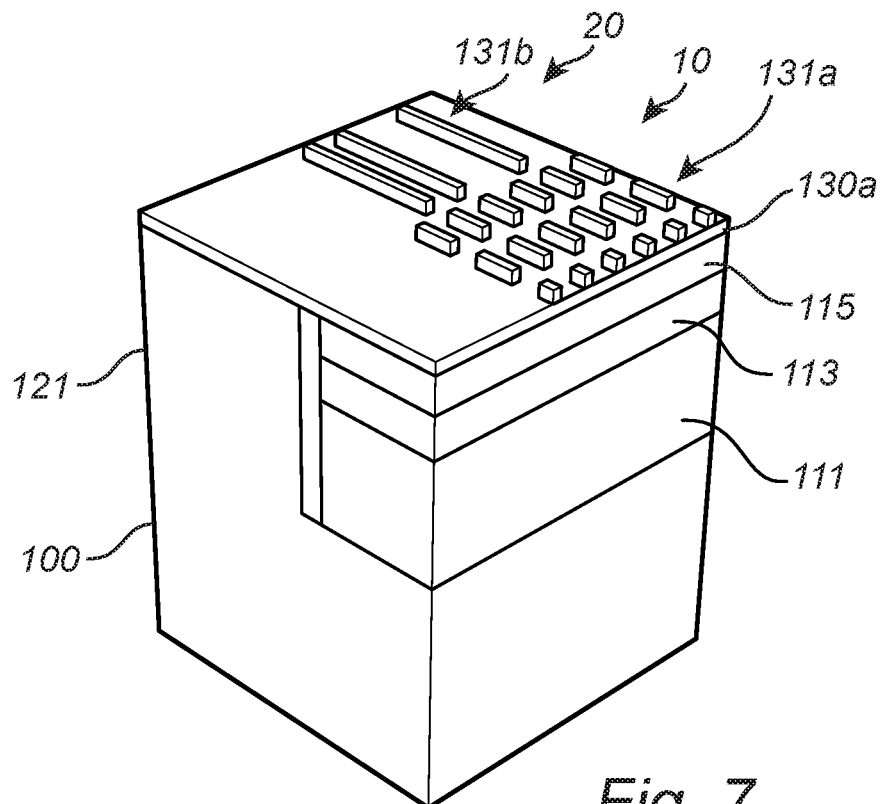
Figure 8:
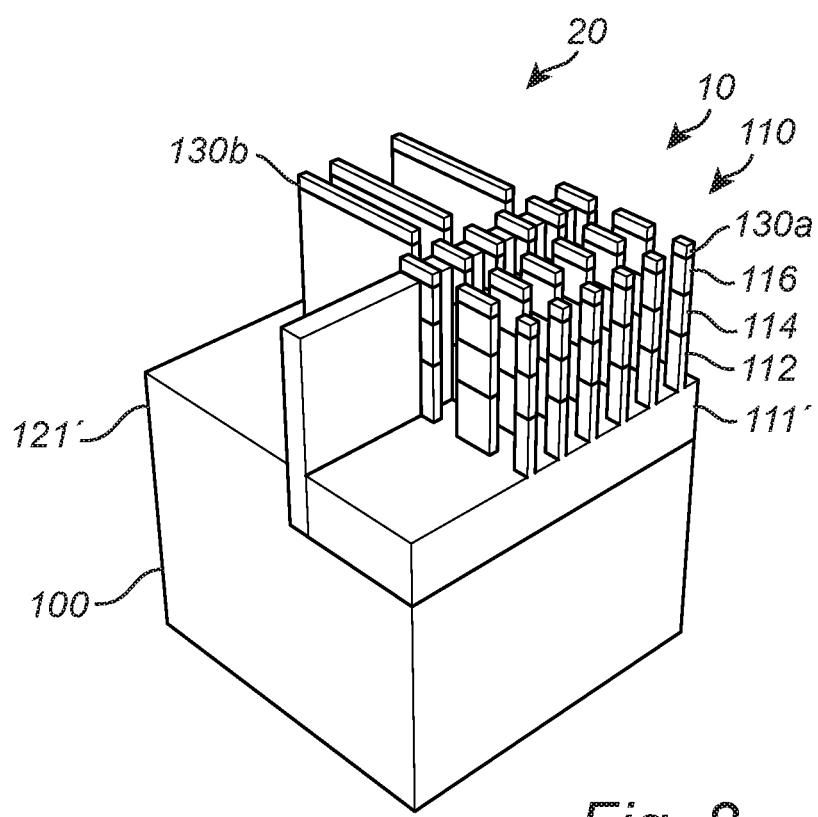
Figure 9:
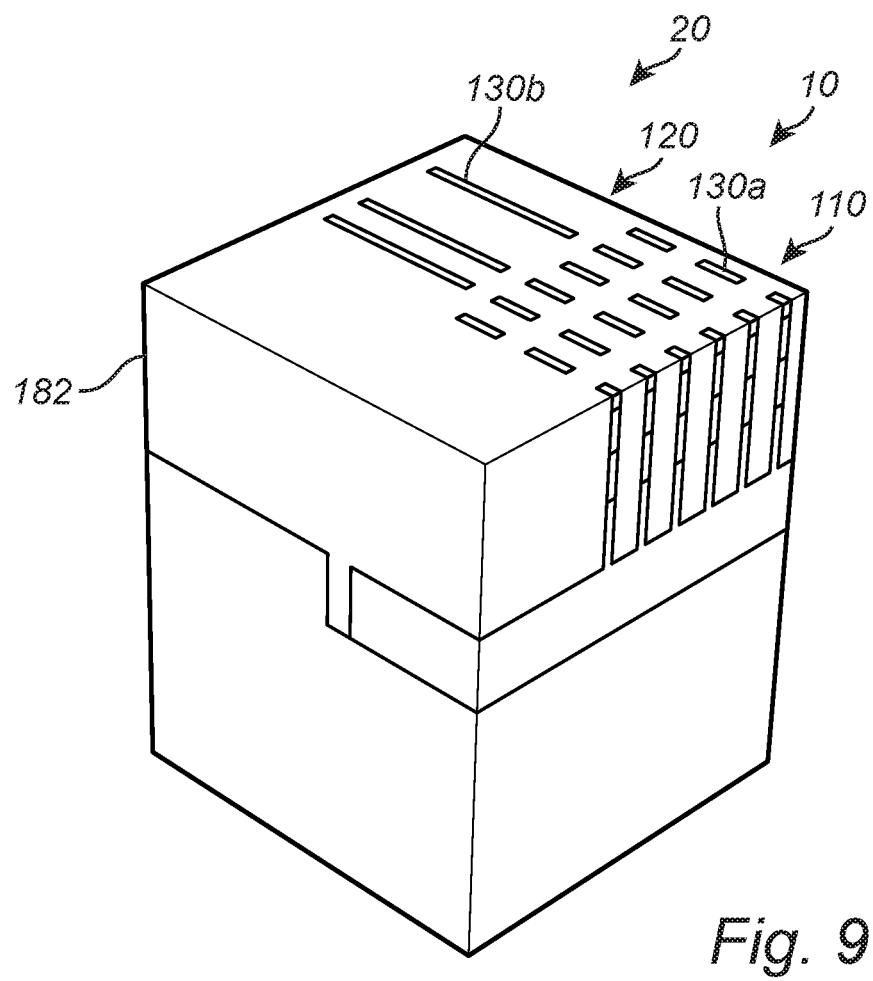
Figure 10:
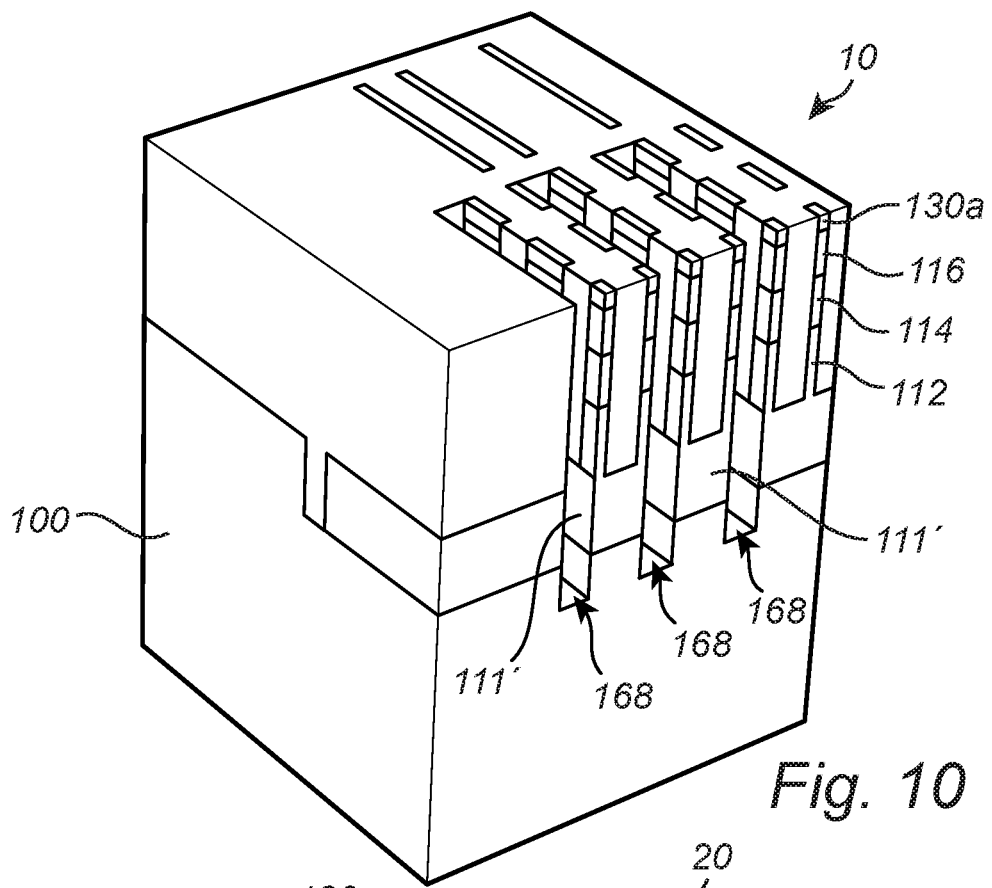
Figure 11:
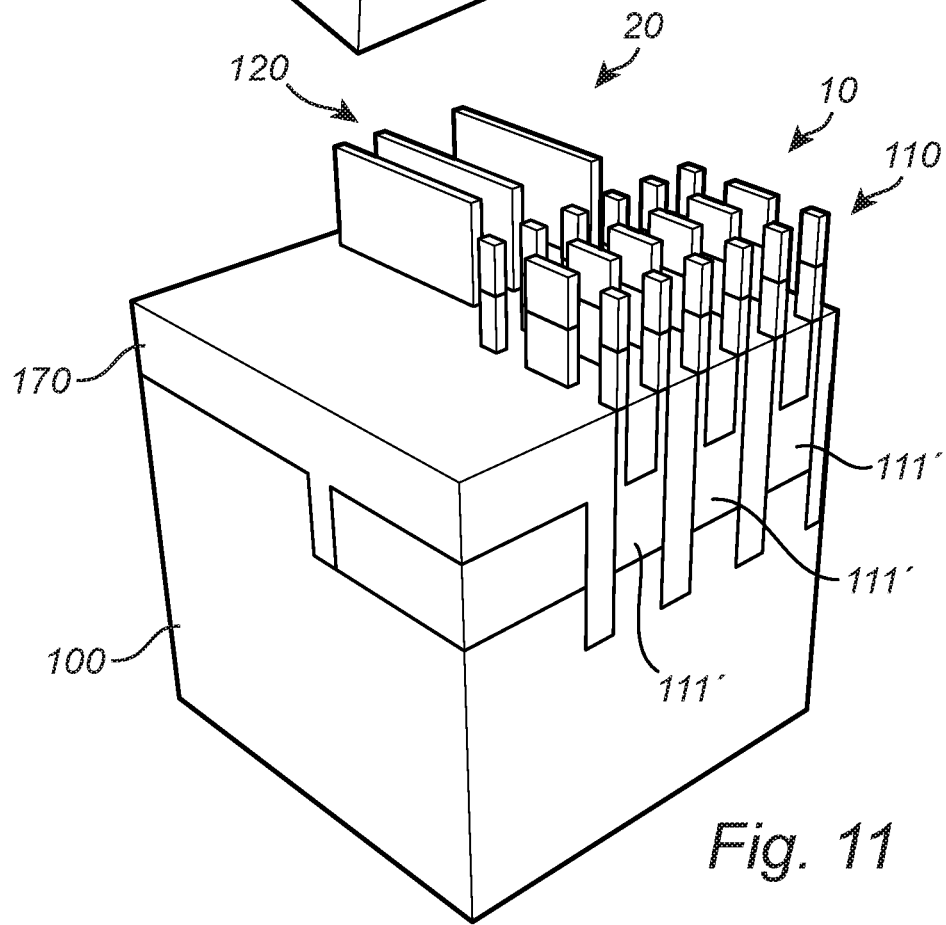
Figure 22A:
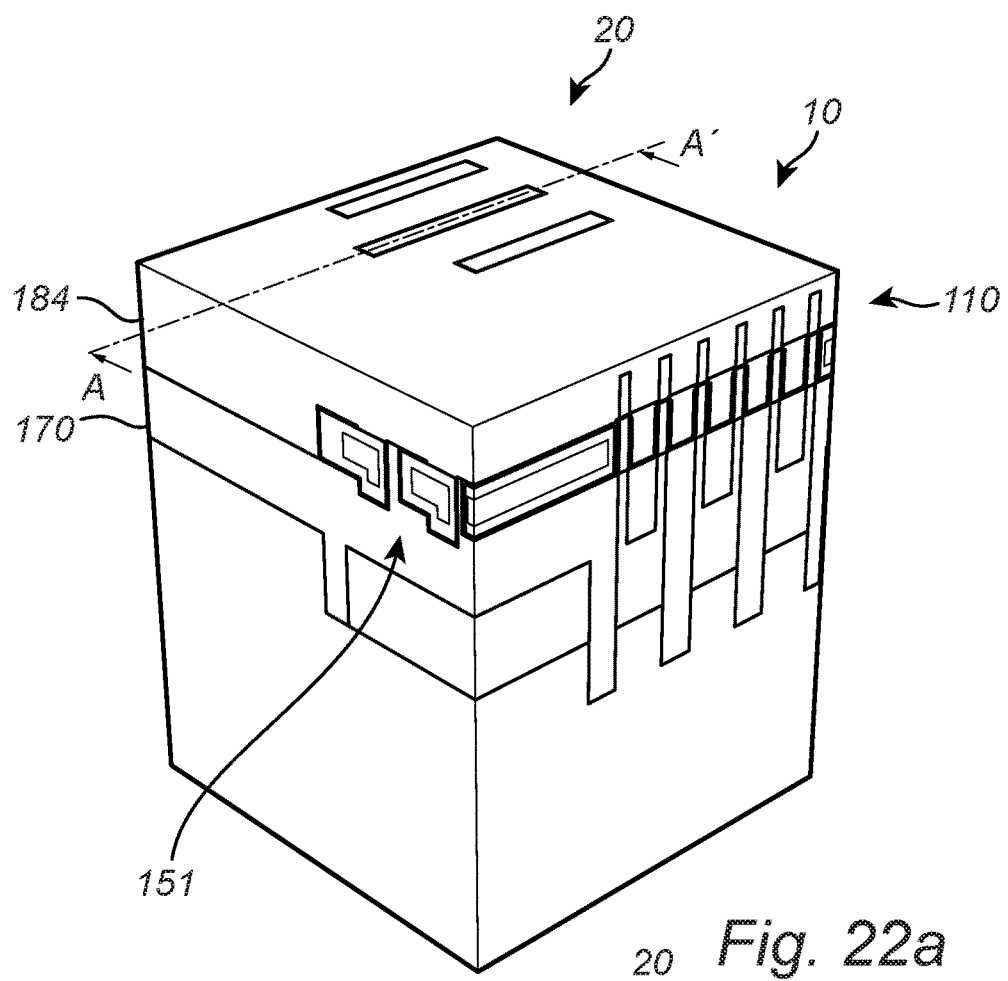
Figure 22B:
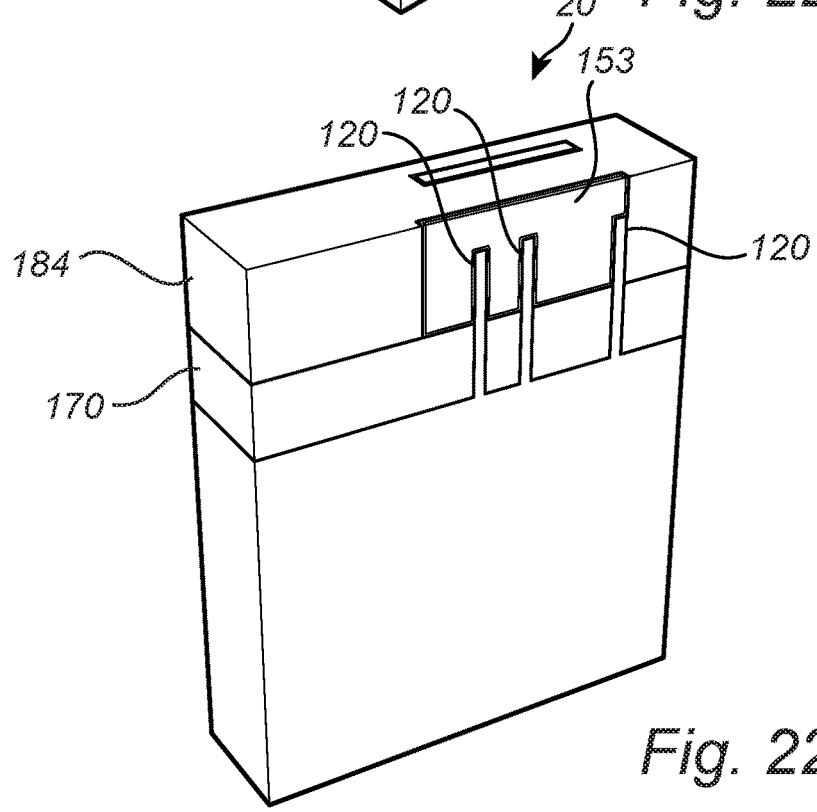
Figure 23:
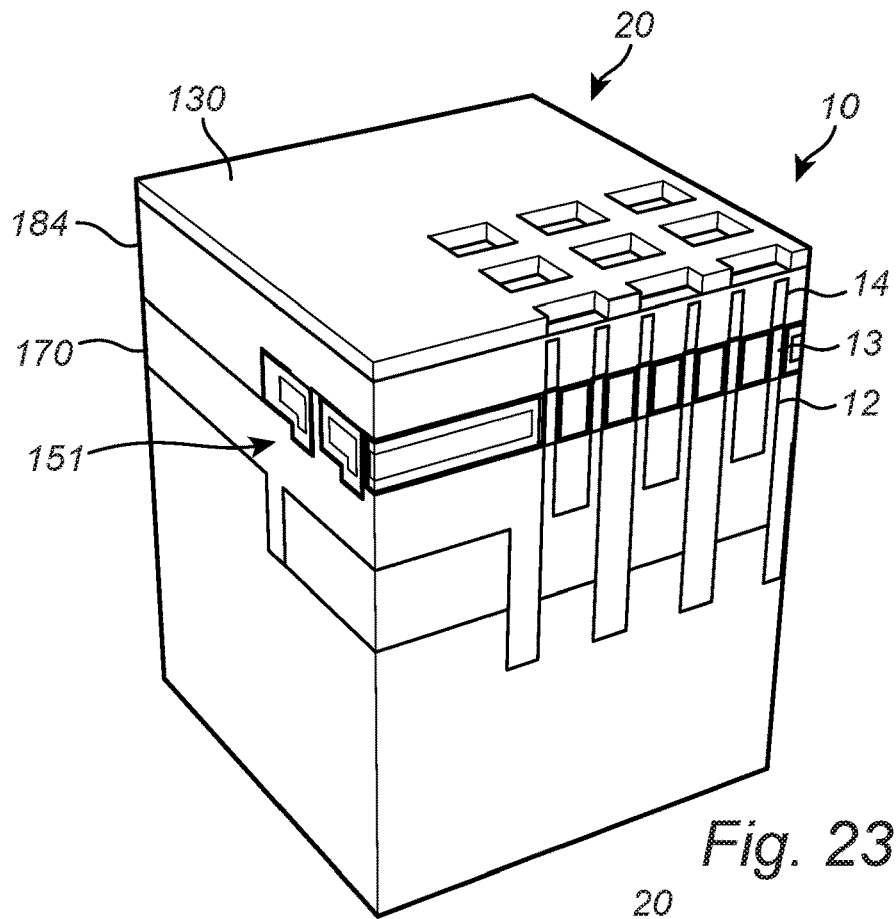
Figure 24:
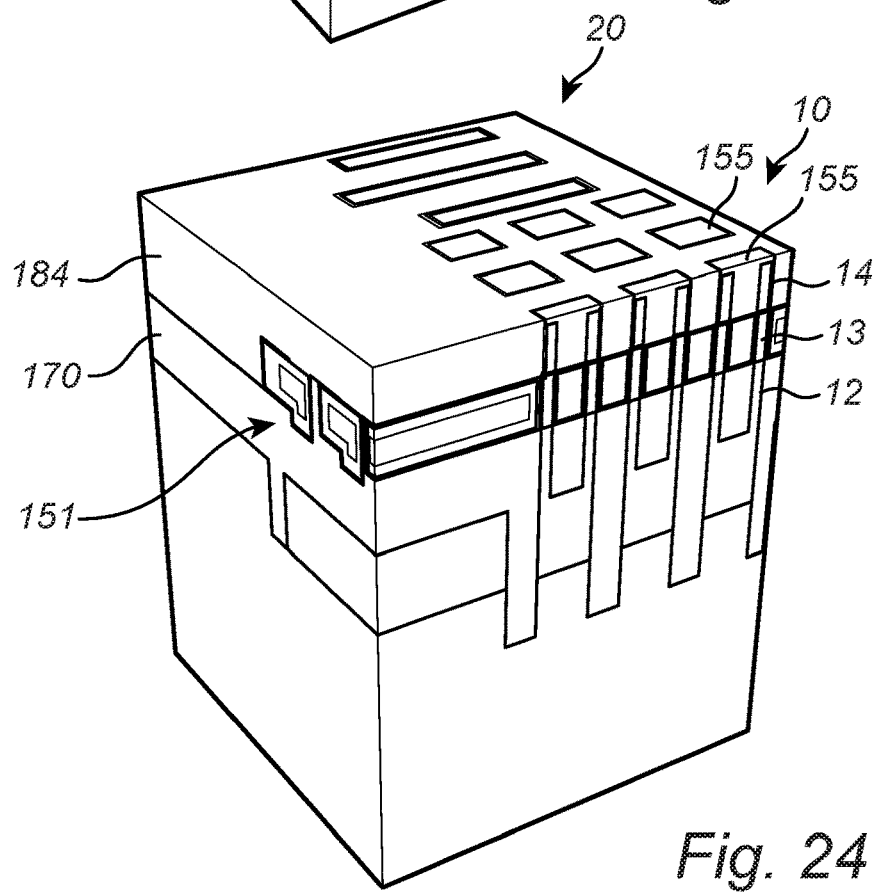

In summary, FIGS. 1-5 illustrate an exemplary substrate preparation, FIGS. 6-8 illustrate an exemplary semiconductor structure patterning, FIGS. 9-11 illustrate an exemplary bottom electrode layer partitioning in the VFET region, FIGS. 12-22 illustrate an exemplary gate formation, and FIGS. 23 and 24 illustrate an exemplary top contact formation. The method may comprise further process steps, as will be set out in the following.

Unless stated otherwise, the figures illustrate a perspective view of a section of the substrate 100 along a boundary between the VFET and HFET regions 10, 20. The illustrated planes of section extending through the structure 100 are common to all the figures, unless indicated otherwise. The substrate 100 and the VFET and HFET regions 10, 20 may present a much greater lateral/horizontal extension than shown, beyond the illustrated section. It may further be noted that the relative dimensions of the shown structures, for instance the relative thickness of layers, is schematic and may, for the purpose of illustrational clarity, differ from a physical device structure.

Substrate Preparation

FIGS. 1-5 show process steps relating to the substrate preparation, which includes providing first and second layer structures in the VFET region 10 and the HFET region 20, respectively.

Figure 1:
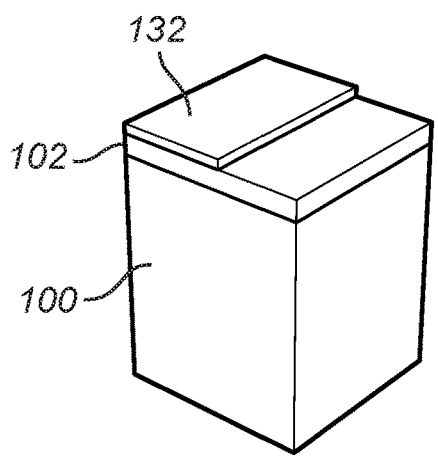
FIGS. 1 to 24 illustrate intermediate structures at various stages of fabricating a semiconductor device, according to various embodiments.

FIG. 1 shows the starting substrate 100 for the process. The substrate 100 is a semiconductor substrate, for example, a substrate including at least one semiconductor layer. The substrate 100 may be a single-layered semiconductor substrate, for instance formed by a bulk substrate. The substrate may also be a multi-layered substrate, for instance formed by an epitaxially grown semiconductor layer on a bulk substrate, or a semiconductor-on-insulator (SOI) substrate.

As further shown in FIG. 1, a mask layer 102 may be formed on the substrate 100. The mask layer 102 may for instance be an oxide layer (such as $SiO_2$ orSiOC) or a nitride layer (such as SiN). The mask layer 102 may for instance be deposited using chemical vapor deposition (CVD) or atomic layer deposition (ALD). If the mask layer 102 is formed of $SiO_2$, the mask layer 102 may also be formed by oxidation.

A further mask 132 may be formed on the mask layer 102. The further mask 132 may for instance be a resist-based mask patterned using lithography. However, it is also possible to form the mask 132 from a lithographic mask layer stack (a "litho-stack") including a number of mask layers (e.g., one or more anti-reflective coatings, organic spin-on layers and/or transfer layers etc.) below a top-most resist-based layer, and patterned by transferring a lithographically defined pattern in the resist-based layer into the lower layers of the stack by etching.

Figure 2:
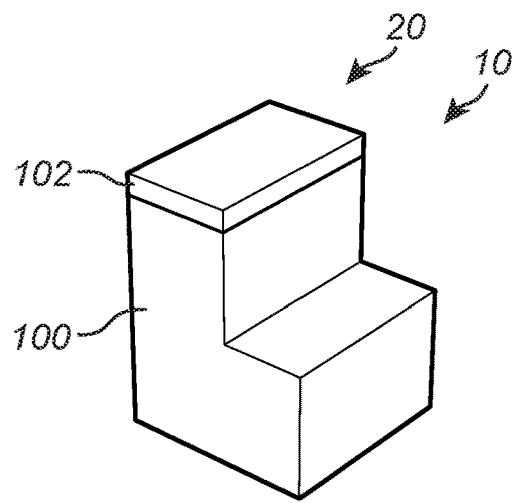

In FIG. 2, the mask layer 102 has been patterned to define a mask 102 covering the substrate 100 in the HFET region 20 and exposing the substrate 100 in the VFET region 10. The mask layer 102 thus defines the respective horizontal dimensions of the VFET region 10 and the HFET region 20. The mask layer 102 may be patterned by etching while using the further mask 132 as an etch mask. A wet-etching or dry-etching process allowing the mask layer 102 to be etched selectively with respect to the further mask 132 may be employed, wherein selective etching may be understood as etching such that exposed portions of the mask layer 102 may be removed while portions of the mask layer 102 masked by the further mask 132 may be preserved. The further mask 132 may be removed after the patterning of the mask layer 102.

As further shown in FIG. 2, the VFET region 10 of the substrate 100 may be recessed by etching the substrate 100 in the VFET region 10 while using the mask layer 102 as an etch mask. The substrate 100 may be recessed in the VFET region 10 to a depth such that a vertical separation between the upper surface of the recessed VFET region 10 and the upper surface of the HFET region 20 matches an intended height of the layer structure which is to be formed in the VFET region 10. A wet-etching or dry-etching process may be used to etch the substrate 100.

Figure 3:
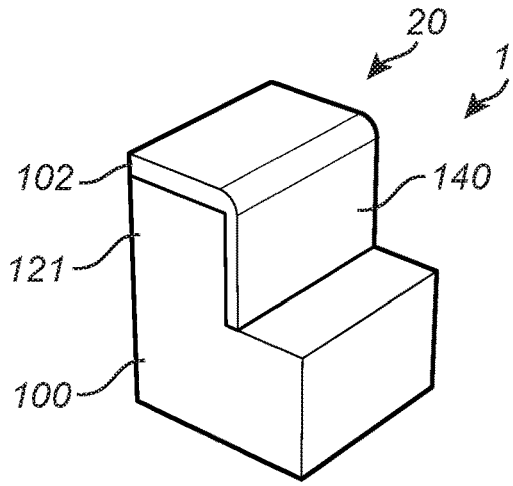

As shown in FIG. 3, subsequent to recessing the VFET region 10 of the substrate 100, an insulating layer 140 may be formed on a sidewall of the VFET region 10, e.g., the sidewall formed during the recessing. The insulating layer 140 may be formed of any of the materials mentioned in connection with the mask layer 102. Forming the insulating layer 140 may comprise depositing a conformal insulating layer in the VFET region 10 and the HFET region 20. A conformal layer deposition may for instance be achieved by a deposition process such as ALD. Thereafter, portions of the conformal insulating layer deposited on horizontally oriented surfaces may be removed by a vertical anisotropic etch process, such that the insulating layer 140 remains on the sidewall. The insulating layer 140 may define a physical and electrical separation between the layer structures of the VFET region 10 and the HFET region 20 and further act as a mask during subsequent epitaxial growth processes discussed in the following.

With reference to FIG. 4, an epitaxial layer structure may be formed in the recessed VFET region 10. The layer structure may include a lower semiconductor layer 111, an intermediate semiconductor layer 113 above the lower semiconductor layer 111 and an upper semiconductor layer 115 above the intermediate semiconductor layer 113. Each one the semiconductor layers 111, 113, 115 may for instance be formed by CVD, physical vapor deposition (PVD), or metal-organic vapor phase epitaxy (MOVPE).

The semiconductor layers 111, 113, 115 form part of a first layer structure provided in the VFET region 10. Meanwhile, the non-recessed portion of the semiconductor layer 121 of the substrate 100 forms part of a second layer structure in the HFET region 20. The first layer structure is formed with a vertical dimension (e.g., height) to define an upper surface being coplanar with an upper surface of the second layer structure HFET region 20.

Various compositions of the first and second layer structures are possible: Each one of the semiconductor layers 111, 113, 115 of the first layer structure may be formed of a different semiconductor material. For example, at least the intermediate semiconductor layer 113 may be formed of a material different from a material of the upper semiconductor layer 115 and different from a material of the lower semiconductor layer 111. According to one exemplary layer structure, the lower semiconductor layer 111 may be a Si$_{1-x}$Ge$_x$ layer, the intermediate semiconductor layer 113 may be a Si$_{1-y}$Ge$_y$ layer, and the upper semiconductor layer 115 may be a Si$_{1-z}$Ge$_z$ layer, where 0≤x≤1, 0<z≤1, and 0≤y<x, z. The Ge-content of the lower semiconductor layer 111 and upper semiconductor layer 115 may for instance be in the range of 10 to 90% (e.g., 0.1≤x≤0.9 and 0.1≤z≤0.9), or 20 to 30% (e.g., 0.2≤x≤0.3 and 0.2≤z≤0.3), while the intermediate semiconductor layer 113 may be a layer including, or at least substantially including of Si (e.g., y=about 0). For instance, the first layer structure may include an intermediate layer 113 substantially made of Si and having a lower Ge-content than lower semiconductor layer 111 and upper semiconductor layer 115 which may be various concentrations of Si and Ge which may facilitate subsequent gate formation steps, as will be further described below.

The lower semiconductor layer 111 may be doped such that the lower semiconductor layer 111 may be used to define lower source/drains for the VFET devices that are subsequently formed. The upper semiconductor layer 115 may be doped such that the upper semiconductor layer 115 may be used to define upper source/drains for the VFET devices. The lower semiconductor layer 111 and the upper semiconductor layer 115 may be doped with an n- or p-type dopant, depending on the conductivity type of the device that is to be formed. The intermediate semiconductor layer 113 may be an un-doped layer, or a lightly doped layer, depending on whether an inversion mode (IM) or junction-less (JL) type of VFET device is desired. The layers may be provided with dopants as appropriate, e.g., by in-situ doping or using ion implantation steps subsequent to each respective layer formation.

Meanwhile, the second semiconductor layer including the semiconductor layer 121 of the substrate 100 (remaining un-recessed in the HFET region 20) may be a Si-layer, although a SiGe-layer may also be used. The semiconductor layer 121 may be doped in accordance with the intended conductivity type of the device that is to be formed, or may be un-doped.

In FIG. 5, the mask layer 102 is removed in the HFET region 20, thereby exposing the upper surface of the HFET region 20 formed by the upper surface of the semiconductor layer 121. The insulating layer 140 may remain to define an insulating boundary between the VFET region 10 and the HFET region 20. The mask layer 102 may be removed by etch back (e.g., by wet-etching or dry-etching) and/or polishing, for instance by chemical mechanical polishing (CMP). The use of polishing may make it possible to make the upper surfaces of the VFET region 10 and HFET region 20 co-planar, should the upper surface of the first semiconductor structure in the VFET region 10 not be completely flush with the upper surface of the second semiconductor structure in the HFET region 20 following the epitaxy thereof. The substrate 100 may at the stage shown in FIG. 5 be provided with a common planar upper surface extending throughout the VFET region 10 and the HFET region 20.

Semiconductor Structure Patterning

FIGS. 6-8 illustrate process steps relating to the semiconductor structure patterning, which may include forming a plurality of first semiconductor structures 110 for VFET devices in the VFET region 10 and a plurality of second semiconductor structures 120 for HFET devices in the HFET region 20.

In FIG. 6, a mask layer 131 has been formed above the planar surface of the substrate 100. The mask layer 131 may for instance comprise a resist-based mask or a lithography stack. As shown, a capping layer 130 may be formed prior to the mask layer 131. The capping layer 130 may for instance be formed by a nitride-layer, such as SiN or some other material suitable for capping such as SiOC or SiO$_2$. Further examples include an anti-reflection coating (e.g., a bottom anti-reflective coating (BARC)), a hard mask, or a patterning film.

In FIG. 7, the mask layer 131 has been patterned to define a plurality of discrete first semiconductor structure mask portions 131a above the VFET region 10 and a plurality of discrete second semiconductor structure mask portions 131b above the HFET region 20. The mask layer 131 may be patterned using lithography, and possibly followed by etching if the mask layer 131 is formed by a lithography stack.

In FIG. 8, the first layer structure in the VFET region 10 and the second layer structure in the HFET region 20 have been patterned in an etching step applied simultaneously to the first layer structure and the second layer structure. During the etching, the mask portions 131a, 131b may act as etch masks such that a plurality of first semiconductor structures 110 may be formed in VFET region 10 and a plurality of second semiconductor structures 120 are formed in the HFET region 20. In some implementations, the pattern formed by the mask portions 131a, 131b is first transferred into the capping layer 130 in a first etch step, to define capping layer portions 130aa, 130ab. Then, in a subsequent step, the semiconductor structures may be etched using the mask portions 131a, 131b and the capping layer portions 130aa, 130ab as a combined etch mask. A wet-etching or dry-etching process for semiconductor patterning may be used.

Each first semiconductor structure 110 may include a lower layer portion 112, an intermediate layer portion 114, and an upper layer portion 116, said portions being formed by remaining portions of respective original lower, intermediate and upper semiconductor layers 111, 113, 115. Each second semiconductor structure 120 may include a portion of the semiconductor layer 121.

Following the etching, the mask portions 131a, 131b may be removed. As shown, the first and second semiconductor structures 110, 120 may however remain capped by the capping layer portions 130a, 130b, formed by the remaining portions of the capping layer 130.

As shown, the first semiconductor structures 110 may be formed as vertically oriented "nanosheets", e.g., with an oblong rectangular cross-sectional shape. However, the first semiconductor structures 100 may also be vertically oriented "nanowires" and may have a square or rounded cross-sectional shape. The second semiconductor structures 120 may, as shown, be formed as elongated fin-shaped structures. For ease of readability, the first semiconductor structures 110 will in the following be referred to as "pillars" while the second semiconductor structures will be referred to as "fins".

The simultaneous etching of the first layer structure 110 and second layer structure 120 may comprise etching back exposed upper surface portions of the first and second layer structures 110, 120 to corresponding vertical levels, such that the pillars and fins 110, 120 present corresponding heights above the etched back surfaces, or, put differently, have upper surfaces located at corresponding vertical levels above the etched back surfaces.

The etching may be stopped at the lower layer 111' such that the lower layer 111' remains un-etched. Accordingly, the pillars 110 may protrude vertically from the remaining lower layer 111'. Correspondingly, the fins 120 may protrude vertically from a remaining un-etched semiconductor layer portion 121'.

The lower and upper semiconductor layer portions 112, 116 of a pillar 110 may be used for forming the lower and upper source/drains, respectively, of the final VFET devices, and may therefore hereinafter be referred to as lower source/drain portion 12 and upper source/drain portion 14, respectively. Similarly, the intermediate semiconductor layer portion 114 may be used to accommodate the channel of the final VFET device, and may therefore herein after be referred to as channel portion 13. Accordingly, the channel portion 13 is arranged between the source/drain portions 12, 14 and extending vertically between the two. Put differently, the source/drain portions 12, 14 are located at vertically opposite ends of the channel portion 13.

Moreover, due to the above-discussed doping of the lower layer 111, the lower layer portion 111' may, together with the lower layer portions 112 protruding therefrom, define lower source/drains or lower source/drain regions for the VFET devices to be formed. The lower layer 111' may be referred to as the "bottom electrode layer".

Bottom Electrode Layer Partitioning

FIGS. 9-10 show process steps relating to the partitioning or definition of the lower layer/bottom electrode 111', e.g., which may include forming shallow trench isolation (STI) in the lower layer 111' in the VFET region 10.

In FIG. 9, the pillars 110 in the VFET region 10 and the fins 120 in the HFET region 20 have been embedded in an insulating layer 182. The insulating layer 182 may for instance be formed of SiO$_2$, or a low-K dielectric. The insulating layer 182 may be formed by depositing an insulating material (e.g., by CVD), followed by etch back and/or polishing to reduce a thickness of the insulating layer 182 such that the upper surfaces of the pillars 110 and fins 120 are exposed (or as in the illustrated case to expose the caps 130a, 130b formed thereon).

In FIG. 10, trenches 168 have been formed in the bottom electrode layer 111' in the VFET region 10. The trenches 168 may as shown extend completely through the bottom electrode layer 111', into an underlying thickness portion of the substrate 100. The bottom electrode layer 111' may accordingly be partitioned into a number of individual lower layer portions/bottom electrodes 111". Accordingly, the bottom electrodes 111" may together with the lower layer portions 112 protruding therefrom, define lower source/drains or lower source/drain regions for the VFETs. In FIG. 10, trenches 168 are formed between every second "row" of pillars 110. This is however merely one example and it is equally possible to form trenches 168 in a less dense manner such that further pillars 110 may share bottom electrodes 111".

In FIG. 11, the trenches 168 have been filled with insulating material, thereby separating the bottom electrodes 111" with STI. The insulating material may for instance be of a same material as the insulating layer 182, and may be formed in a corresponding manner. Following deposition of the insulating material etch back of the deposited insulating material and the insulating layer 182 may be performed to form a bottom insulating layer 170, embedding bottom parts of the pillars 110 and the fins 120 and the bottom electrodes 111'. The bottom insulating layer 170 may be formed with a thickness such that an upper surface of the insulating layer 170 extends at a vertical level below the channel portions 13 of the pillars 110.

In some implementations, the bottom electrode layer 111' partitioning may be performed at an earlier stage of the process. For instance, trenches corresponding to the trenches 168 may instead be patterned in the lower layer 111 in connection with the patterning of the semiconductor structures 110, 120 wherein the process may proceed directly to gate formation after defining the pillars 110 and fins 120.

Gate Formation

FIGS. 11 to 24 show process steps relating to the gate formation, which may comprise forming of sacrificial or dummy gate structures and subsequent replacement of the sacrificial or dummy gate structures by final gate structures.

FIG. 11 illustrates a perspective view of the semiconductor substrate 100, after the VFET region 10 and the HFET region 20 have been provided with pillars 110 and fins 120, respectively.

In the following, exemplary processing steps for forming gate structures 151, 153 extending along the channel portions 13 of the pillars 110 and across the channel portions 23 of the fins 120 will be discussed. The gates structures 151, 153 may be formed utilizing a replacement metal gate process, of which exemplary process steps will be discussed with reference to the following figures.

Figure 12:
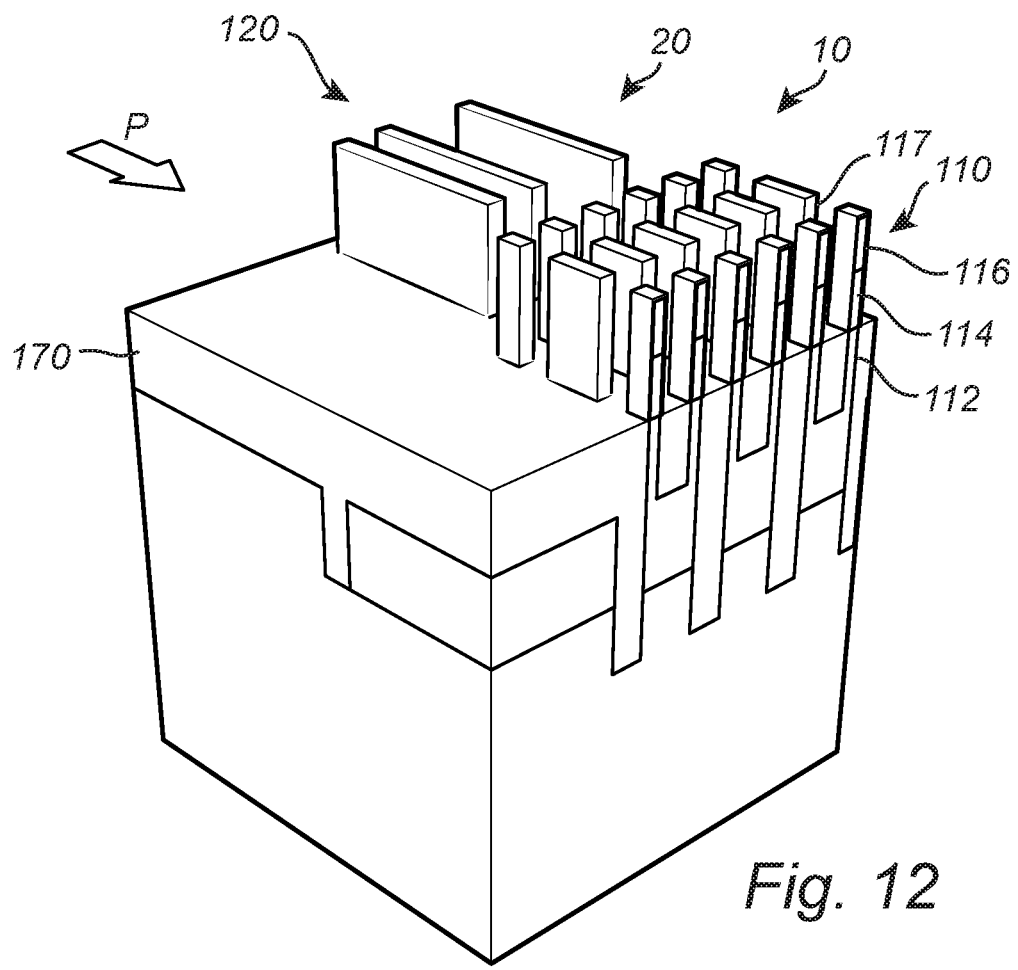

In FIG. 12 the pillars 110 have been provided with a spacer material 117. The spacer material 117 may be formed by subjecting the semiconductor structures 110 to an oxidation process "P", in which an oxide layer is formed. As shown, a spacer in the form of an oxide layer 117 may also be formed on the surfaces of the fins 120 exposed above the bottom insulating layer 170. In another example, the fins 120 may be protected by a mask counteracting the oxide from being formed on the second semiconductor structure 120 during the oxidation. In another example, an etch process may be employed to remove oxide from surfaces other than the peripheral surfaces of the source/drain portions 12, 14 of the first semiconductor structures 110.

As disclosed above, the intermediate layer 113, forming the channel portions 13, and the semiconductor layer 121, forming the fins 120, may be formed of materials different from the materials forming the lower and upper layers 111, 115 of the first layer structures 110 in the VFET region 10. For instance, since SiGe oxidizes at a much higher rates than Si (in particular at temperatures between 400° C. and 700° C.), forming the lower and upper layers 111, 115 with a composition of SiGe and the intermediate layer 113 of Si or a composition of SiGe with a lower Ge-content than the lower and upper layers 111, 115 enables a selective or preferential oxidation of the upper and lower layer portions 112, 116, such that a thicker oxide layer 117 may be grown on the upper and lower layer portions 112, 116 than on the intermediate layer portion 114 and on the second semiconductor structures 120. The oxide may be formed at a temperature and pressure selected such that the oxidation proceeds faster on the upper and lower layer portions 112, 116 than on the intermediate channel portion 114. In this way a thicker spacer layer 117 may be produced on the peripheral surfaces of the source/drain portions 12, 14 of the pillars 110, and a relatively thin spacer layer, or no spacer layer at all, formed on the peripheral surfaces of the channel portions 13 of the fins 120. A uniform etch of the spacer layer may result in the spacer material being completely removed from the channel portions 13 and/or the fins 120 and not the source/drain portions 12, 14.

Figure 13:
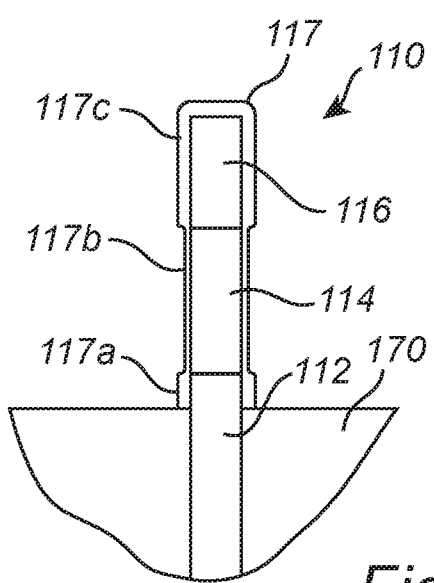

FIG. 13 schematically illustrates an enlarged cross section of a pillar 110 after the spacer material 117 has been formed. In the present example, the pillar 110 is a pillar formed of upper and lower layer portions 112, 114 and an intermediate layer portion 114, wherein the upper and lower layer portions 112, 114 form the upper and lower source/drain portions 12, 14 and the intermediate layer portion 114 forms the channel portion 13 extending vertically between the source/drain portions 12, 14. During the oxidation process, a spacer 117a has been formed on peripheral surfaces of the part of the lower layer portion 112 that protrudes above the bottom insulating layer 170. Further, a spacer 117c has been formed on peripheral portions of the upper layer portion 116. As illustrated in the figure, an oxide layer 117b may also be formed at sidewall portions of the intermediate layer portion 114. The oxide layer 117b at the intermediate layer portion 114 is relatively thin compared to the thickness of the spacers 117a, 117c at the lower and upper layer portions 112, 116. Hence, the the spacers 117a, 117c at the lower and upper layer portiosn 112, 116 may form a pair of spacers 117a, 117c between which the gate may be aligned vertically, in an accurate manner, with respect to the intermediate layer portion 114 forming the channel portion 13 of the VFET device. The oxide layer at the sidewalls of the pillar 110 may etched to remove or at least further reduce the thickness of the oxide layer 117c at the intermediate layer portion 114.

Figure 14:
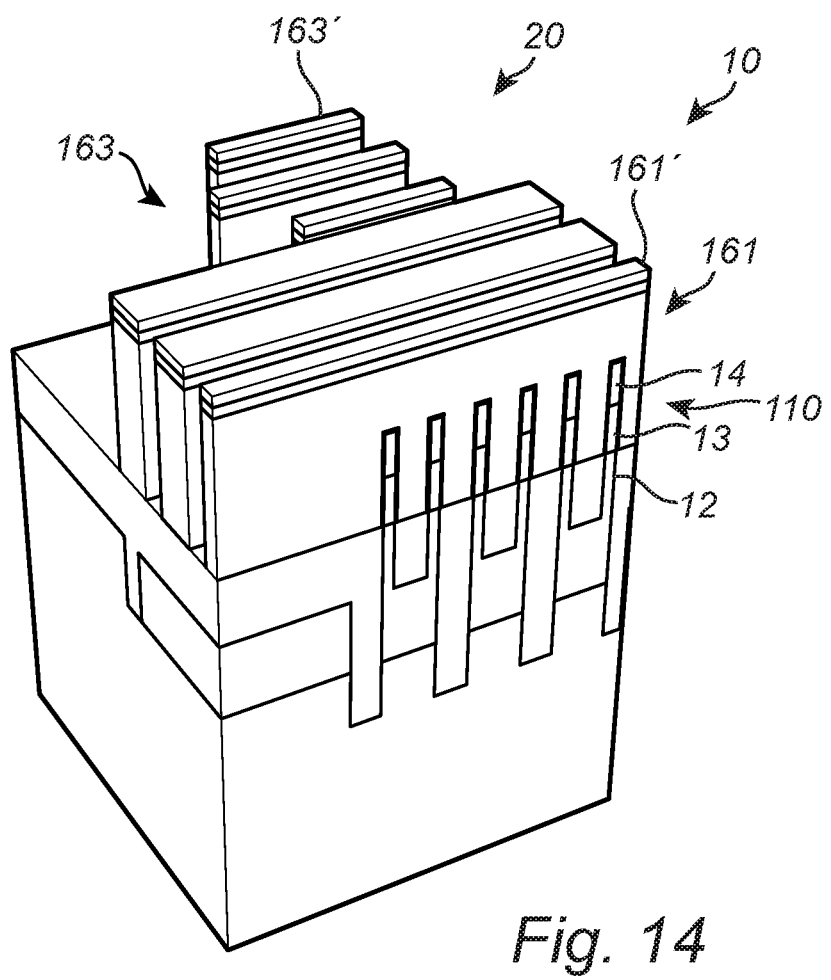

In FIG. 14, a sacrificial or dummy gate layer has been formed above the VFET region 10 and the HFET region 20 of the substrate 100 and patterned, in a simultaneous process over both regions 10, 20, into a set of sacrificial or dummy gates 161, 163. The patterning may be performed by implementing a mask structure 161', 163' (e.g., a hard mask and a nitride layer on top of the sacrificial or dummy gates 161, 163) and a wet etching process or dry etching process. The sacrificial or dummy gate layer may be formed of amorphous silicon, a-Si. In the VFET region 10 shown in the present figure, three sacrificial or dummy gates 161 may extend in parallel over the pillars 110. A width or lateral dimension of the sacrificial or dummy gates 161 may be such that the sacrificial or dummy gates 161 at least partially enclose the channel portions 13 of the pillars 110, as viewed in a horizontal plane. Preferably, the sacrificial or dummy gates 161 may be formed to completely enclose the channel portions 13, thereby enabling forming of gate-all-around (GAA) VFETs. In the HFET region 20, the sacrificial or dummy gate layer has been patterned to form three parallel sacrificial or dummy gates 163 extending across the fins 120.

Figure 15:
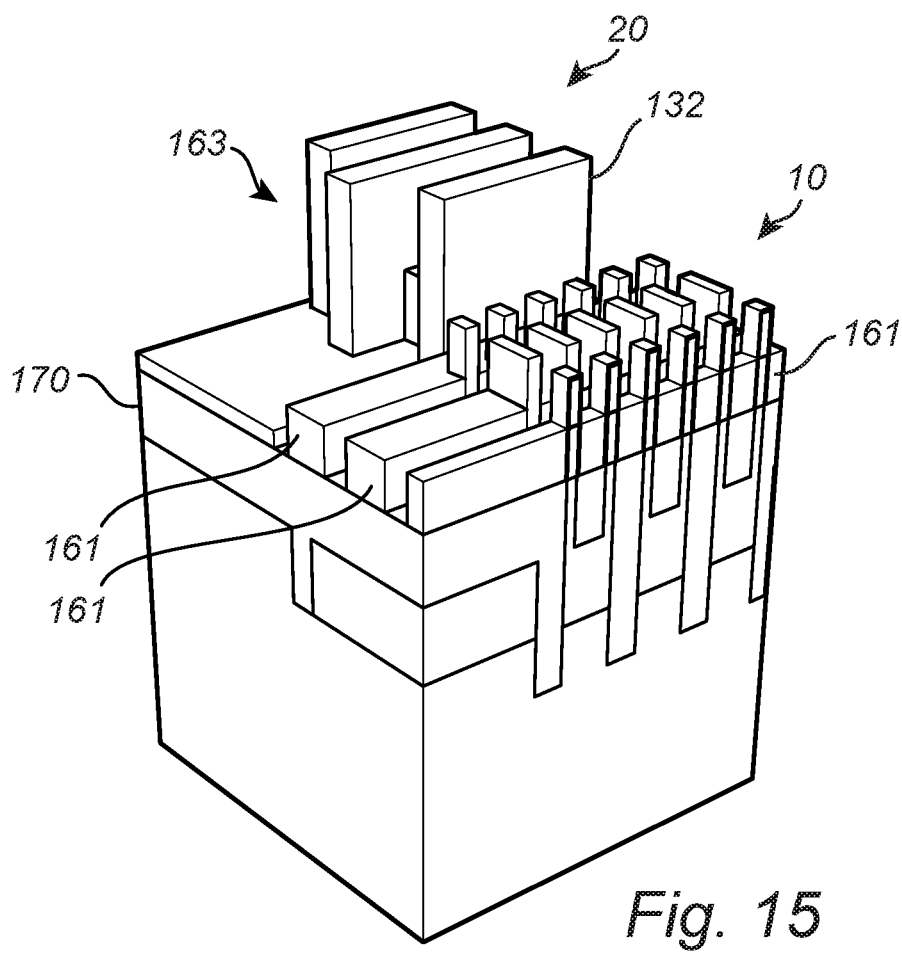

In FIG. 15, the sacrificial or dummy gates 161 in the VFET region 10 have been recessed in an etch back process, to a thickness that may correspond to the gate length of the final VFET device. A vertical anisotropic etch process may be employed to avoid lateral trimming of the sacrificial or dummy gate 161. During the etching the sacrificial or dummy gates 163 in the HFET region 20 may be protected by an etch mask 132, such as a resist-based mask or a hard mask. The etch mask allows for the sacrificial or dummy gates 161 in the VFET region 10 to be recessed down to a desired thickness while leaving the sacrificial or dummy gates 163 in the HFET region 20 intact. The etch back may be preceded with removal of the afore-mentioned mask structure from the upper surfaces of the sacrificial or dummy gates 161. After the etch back of the sacrificial or dummy gates 161 in the VFET region 10, the etch mask 132 may be removed, as well as the above-mentioned mask structures covering upper surfaces of the sacrificial or dummy gates 163, prior to subsequent processing.

Figure 16:
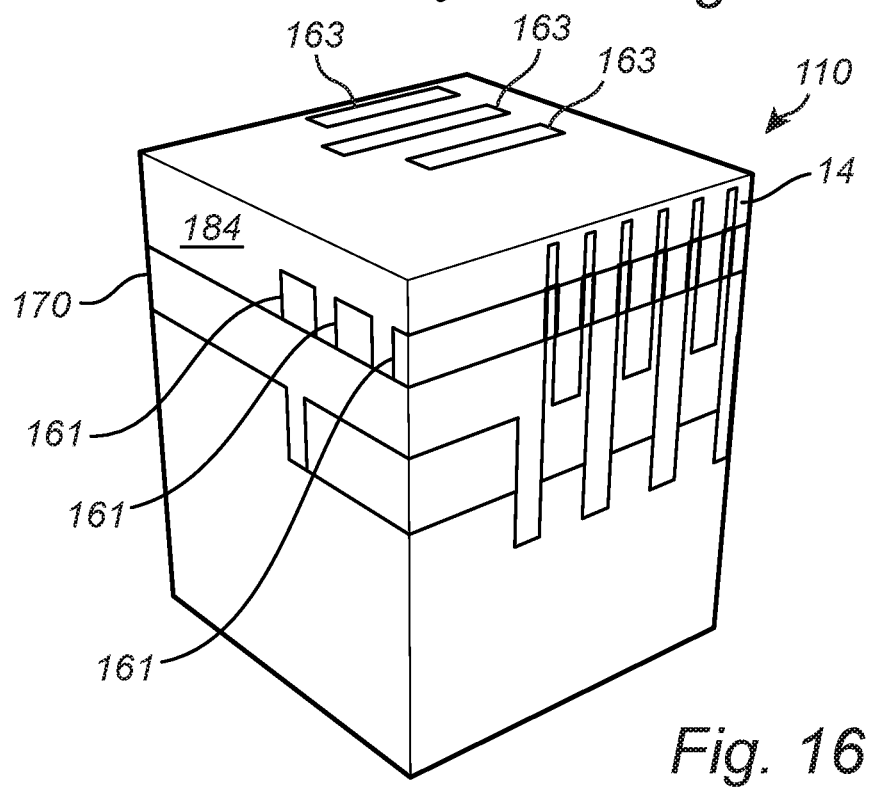

In FIG. 16, the pillars 110 and the fins 120 have been embedded in a dielectric layer 184 of for example $SiO_2$ or another insulating material, such as a low-k dielectric material. The dielectric layer 184 may be deposited using for instance CVD. The dielectric layer 184 may be etched back and/or polished by for example CMP to reduce the thickness until the upper surface of the sacrificial or dummy gates 163 in the HFET region 20 are exposed. The sacrificial or dummy gates 161 in the VFET region may not be exposed yet, due to the previously performed etch back process. Optionally, as illustrated in the present figure, the spacer 117c on the peripheral portions of the upper source/drain portion 14 of the pillars 110 may be removed prior to the forming of the dielectric layer 184. Further, the upper source/drain portion 14 may be formed by replacing the upper layer portion 116 with a source/drain portion 14 that may be epitaxially grown on top of the pillar 110.

Figure 17:
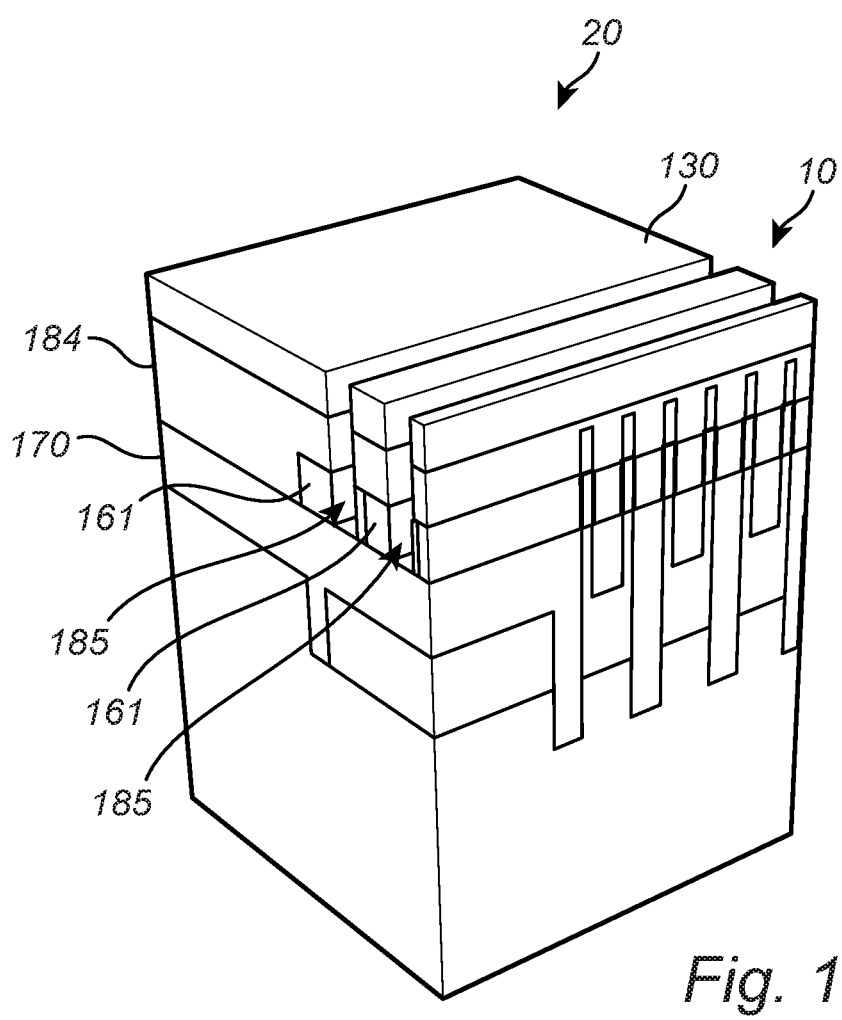

In order to access the sacrificial or dummy gate 161 in the VFET region 10, trenches 185 may be formed in the dielectric layer 184. The result is shown in FIG. 17, wherein an etch mask 130, similar to the one previously used in the etch back of the sacrificial or dummy gates 161 in the VFET region 10, may be provided to protect the sacrificial or dummy gates 163 in the HFET region 20 and to define two parallel trenches 185 above and between the three sacrificial or dummy gates 161 in the VFET region 10. The trenches 185 may be formed by etching through the etch mask 130 all the way down to the bottom insulating layer 170. As shown in the present figure, this allows for the sacrificial or dummy gates 161 in the VFET region 10 to be accessed and etched from the side, in the lateral direction.

FIGS. 18a to 22b illustrate process steps in which the sacrificial or dummy gates 161, 163 are simultaneously replaced with the final gate structures 151, 153. FIGS. 18a, 19a, 20a, 21a, and 22a are perspective views showing a cross section through the pillars 110 in the VFET region 20, and FIGS. 18b, 19b, 20b, 21b, and 22b are cross sections taken along the gate tracks in the HFET region.

Figure 18A:
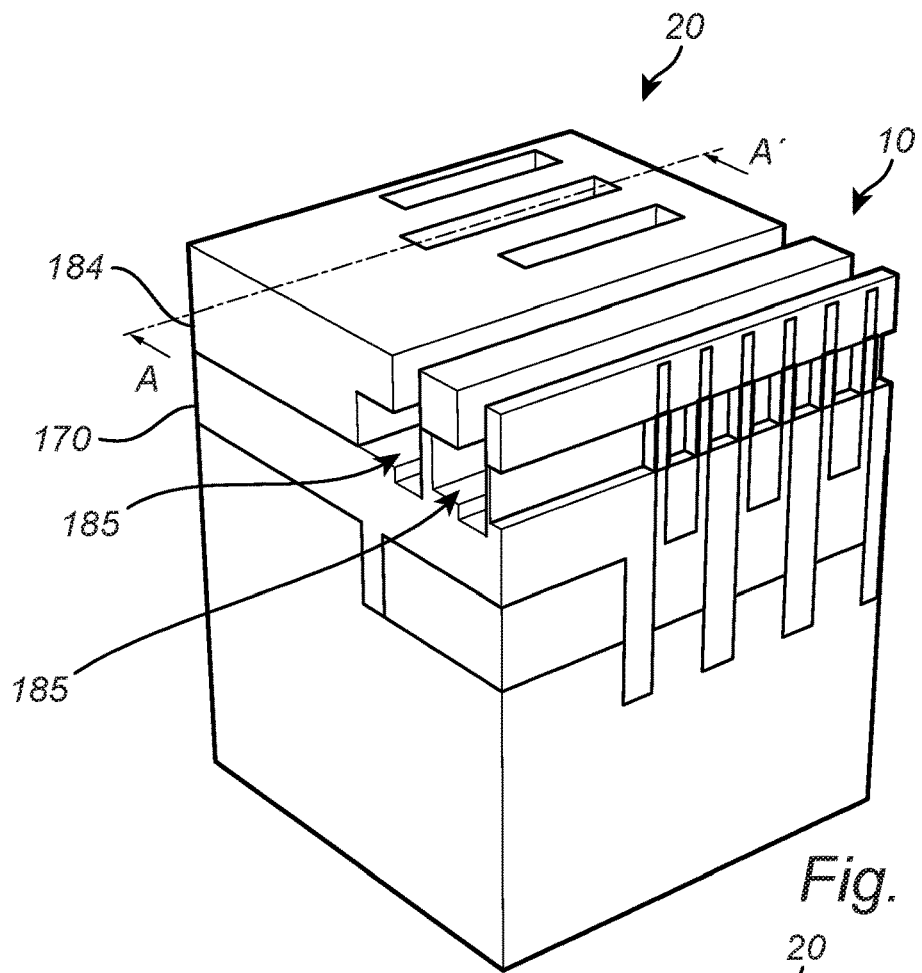
Figure 18B:
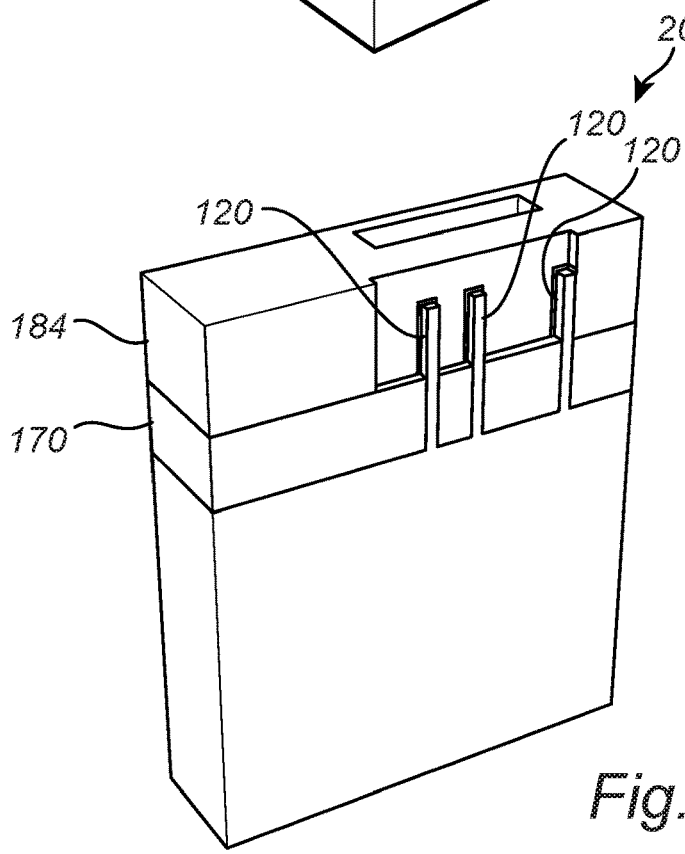

In FIGS. 18a and 18b the sacrificial or dummy gates 161 in the VFET region 10 and the sacrificial or dummy gates 163 in the HFET region 20 have been removed in a common etch process. The sacrificial or dummy gates 161 in the VFET region 10 have been etched through the trenches 185 formed in the dielectric layer 184 in the VFET region 10, whereas the sacrificial or dummy gates 163 in the HFET region 20 have been etched from the top surfaces exposed in the dielectric layer 184. In some implementations, the oxide 117 formed on the surfaces of the fins 120 and at the intermediate layer portion 114 of the pillars 110 during the oxidation process "P" discussed in connection with the example shown in FIGS. 12 and 13 may be removed or at least thinned prior to forming the final gate structures 151, 153.

Figure 19A:
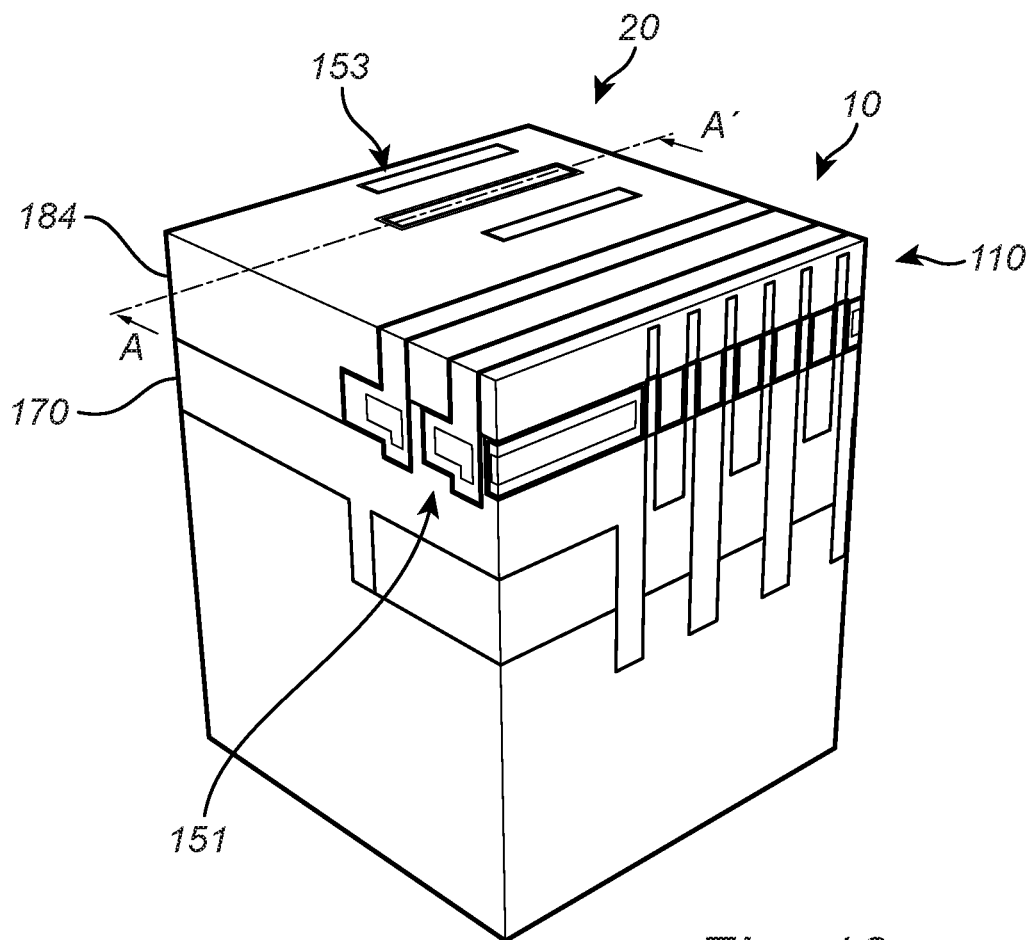
Figure 19B:
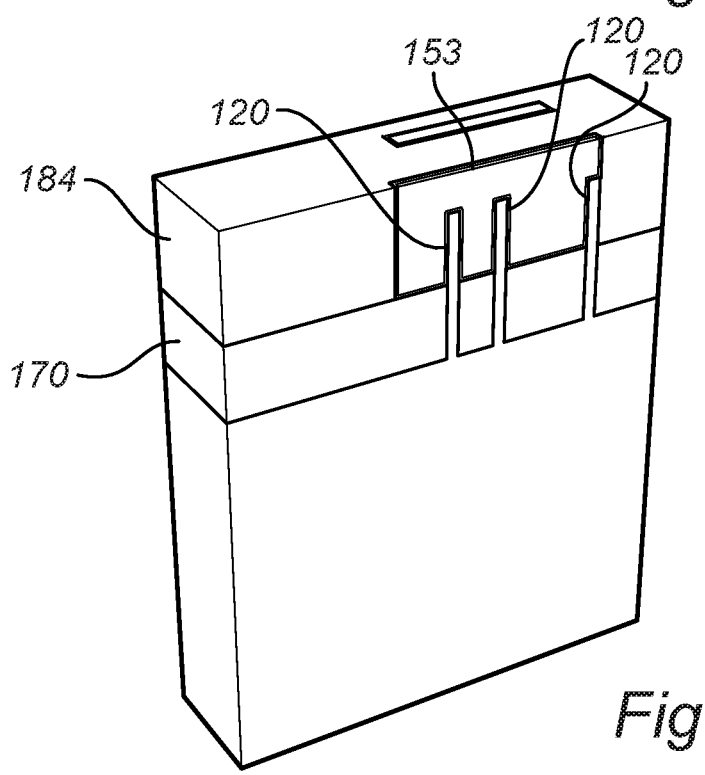

In FIGS. 19a and 19b gate layers have been deposited in place of the sacrificial or dummy gates 161, 163 to form gate structures 151 in the VFET region 10 and gate structures 153 in the HFET region 20. The gate layers may be formed around the pillar 110 and across the fin 120, and may include a gate dielectric layer formed by a gate dielectric material such as $HfO_2$, $ZrO_2$, $Al_2O_3$, or some other high-K dielectric material. The gate dielectric layer may be deposited as a conformal thin film by a deposition process, for instance by ALD. The gate layers may further comprise at least a first conductive layer that is subsequently formed on the gate dielectric layer. The first conductive layer may be formed by an effective work function (EWF) metal. The first conductive layer may for instance be formed by one or more p-type EWF metals such as TiN, TaN, or TiTaN or by one or more n-type EWF metals such as Al, TiAl, TiC, or TiAlC, or compound layers such as TiN/TiAl or TiN/TaN/TiAl. The first conductive layer may be deposited by a deposition process, for instance by ALD, CVD, or PVD. The gate layers may further include a second conductive layer, for instance of W, Al, Co, Ni, Ru or an alloy of two or more of said materials, to provide a gate electrode with a desired electrical properties. The second conductive layer may be deposited by a deposition process, for instance by CVD or by electro-plating. The gate structures 151, 153 may be formed simultaneously in a process that is common for the VFET region 10 and the HFET region 20. Alternatively, the gate structures 151, 153 may be formed partly in a process that is common for both regions 10, 20 and partly in processes that are specific for the respective regions 10, 20. Examples of the latter may include commonly and simultaneously forming one or several of the gate layers, followed by additional processing in only one of the regions 10, 20.

The deposition of the gate layers may be followed by, for example, a CMP process so as to expose an upper surface of the gate structures 151, 153 and enable subsequent processing.

Figure 20A:
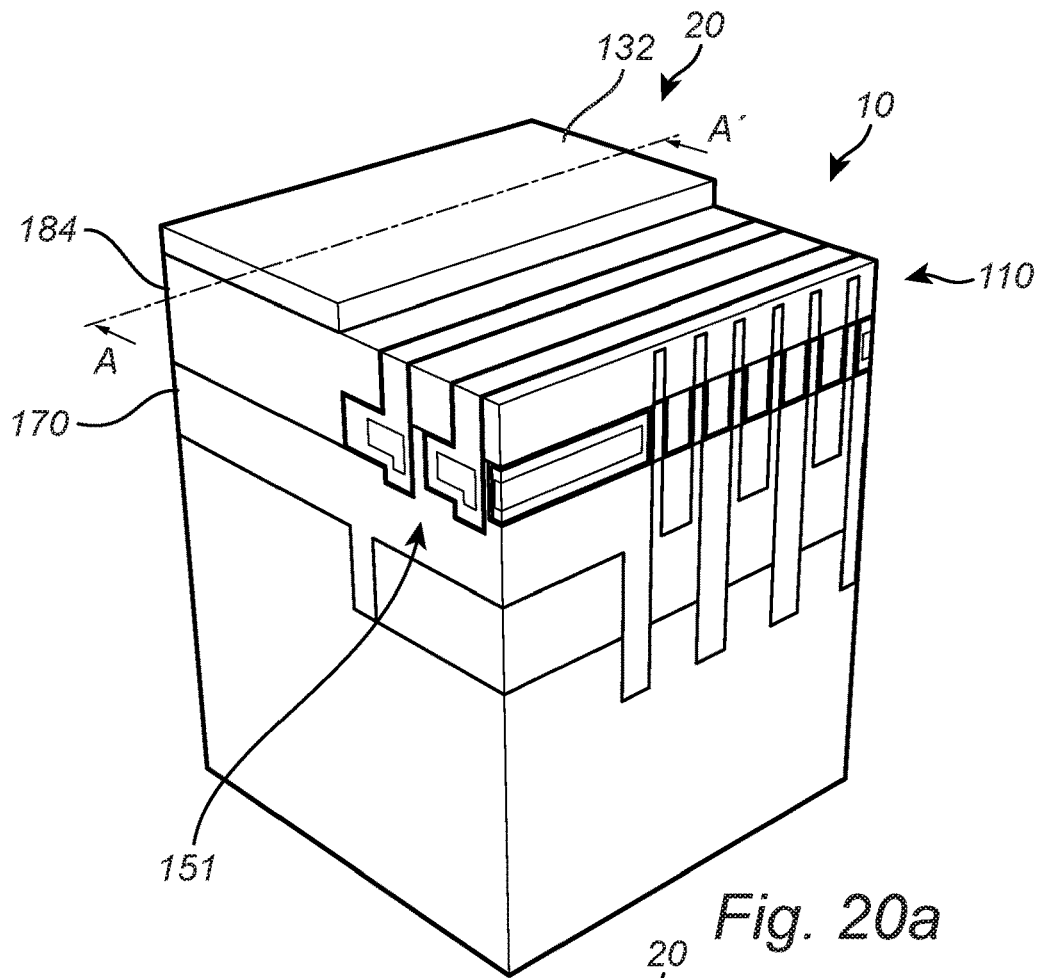
Figure 20B:
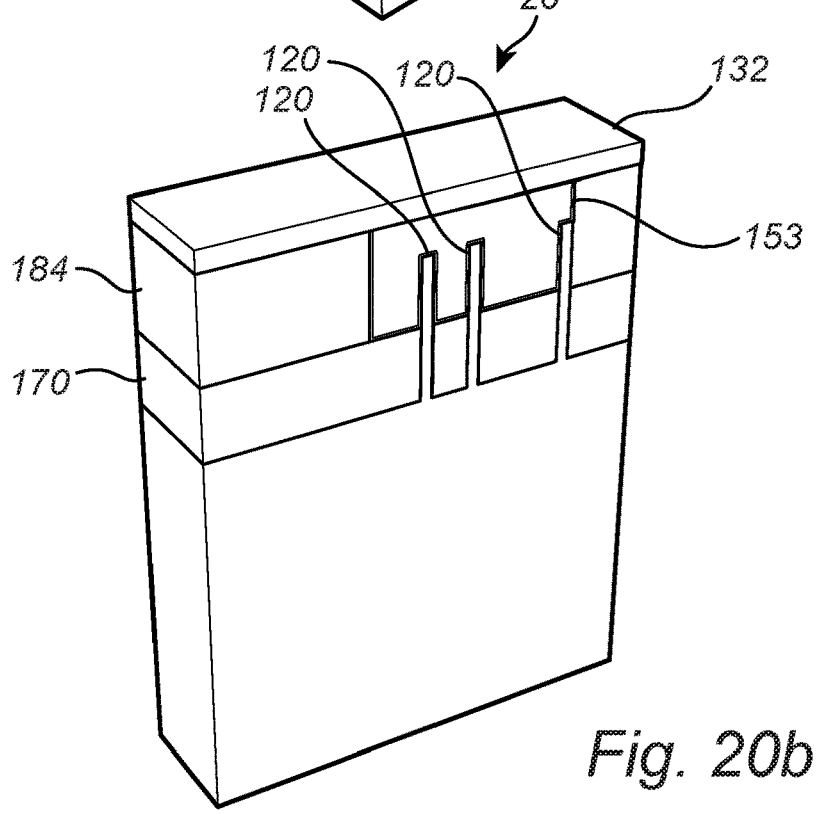
Figure 21A:
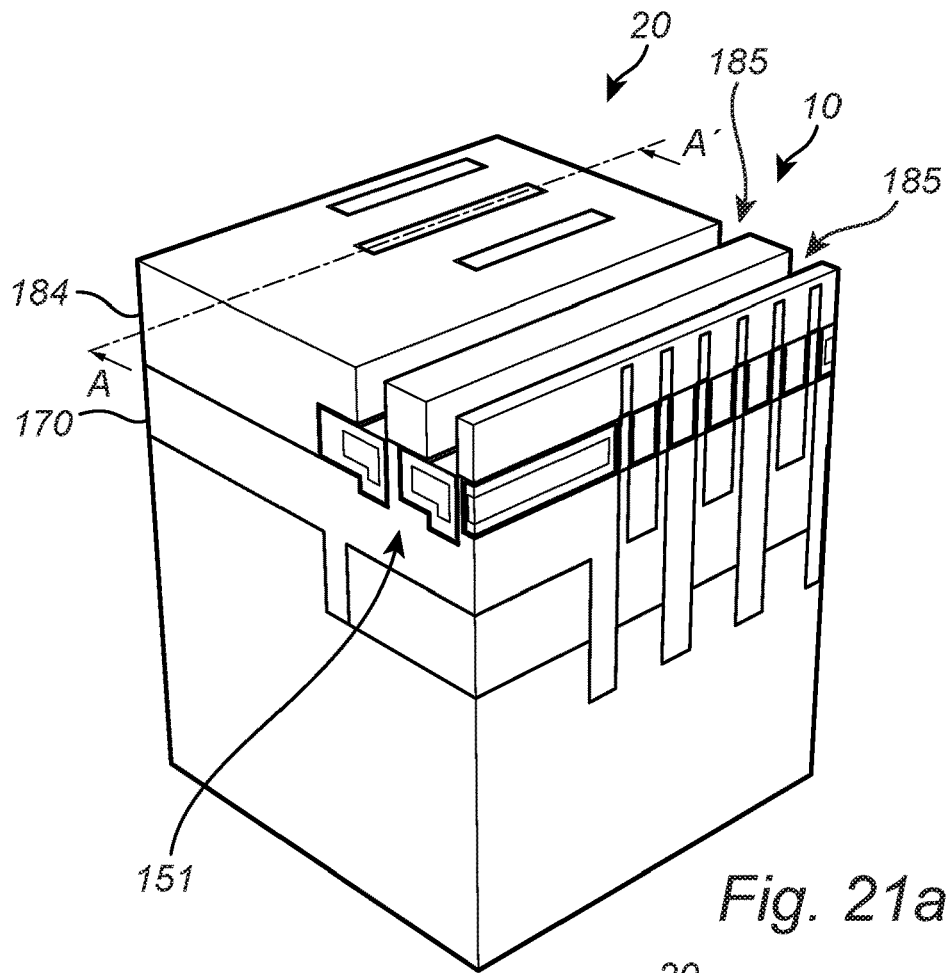
Figure 21B:
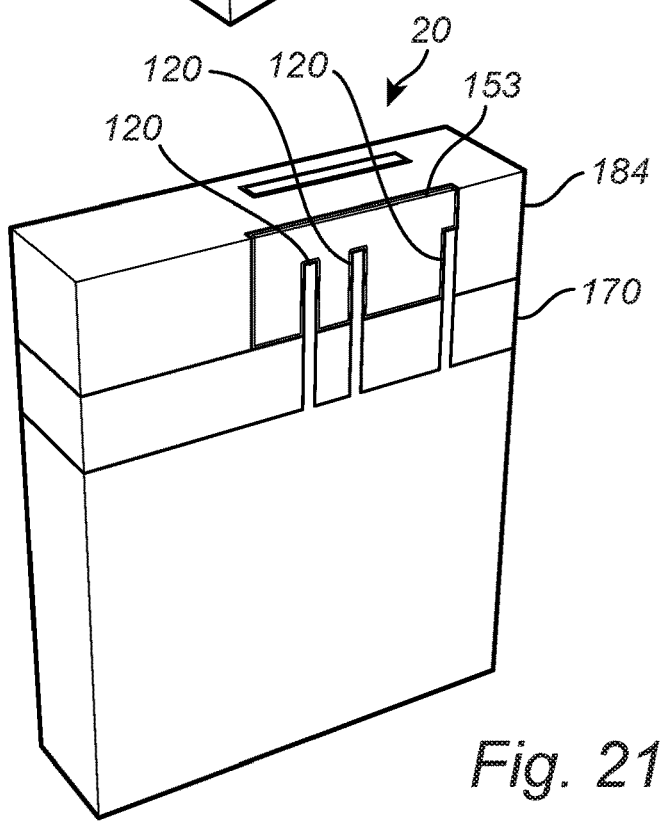

In FIGS. 20a and 20b, the HFET region 20 have been covered by a protecting etch mask portion 132, so as to allow the gate structures 151 in the trenches 185 of the dielectric layer 184 in the VFET region 10 to be recessed. The recessing may comprise wet etching or dry etching gate metal and gate dielectric material forming the gate structures 151. The results of the etching are shown in FIGS. 21a and 21b.

In FIGS. 22a and 22b, the trenches 185 in the VFET region 10 have been filled with a dielectric, e.g., of a same material as the dielectric layer 184, to fill in the dielectric layer 184, thereby leaving the gate structures 151 of the VFET devices covered with dielectric.

The upper source/drain portions 12 of the VFET devices in the VFET region 10 may be accessed electrically from above. In FIG. 23 an etch mask 130 has been formed, which is arranged to protect the HFET region 20 from being etched and to define source/drain contact structures in the VFET region 10.

In FIG. 24, the source/drain contact structures 155, which also may be referred to as "top electrodes," have been formed by etching through the etch mask 130 down to the upper source/drain portions 14 of the VFET devices and filling the trenches with a contact metal, such as for example Al, Co, Ni, W or Ru. In some implementations, the deposition of contact metal may be preceded by epitaxially growing doped semiconductor material on the upper source/drain portions 14, to form enlarged upper source/drain portions for improved electrical contact with the source/drain contact structures 155. In some implementations, the top electrodes 155 may be formed by depositing and patterning a metal layer on the upper source/drain portion 14, and then covering the patterned layer with a dielectric material. The lower source/drain portions 12 of the VFET devices may be electrically connected by forming vertical conductive vias in contact with the bottom electrodes 111', e.g., in a region outside of the illustrated section.

Source/drains may also be epitaxially grown on the fins 120, which subsequently may be contact with corresponding source/drain contact structures in a manner which per se is known in the art, thereby completing formation of finFET devices in the HFET region 20.

In the above the disclosed technology has mainly been described with reference to a limited number of examples. However, as is readily appreciated by a person skilled in the art, other examples than the ones disclosed above are equally possible within the scope of the disclosed technology, as defined by the appended claims. The process steps discussed with reference to FIGS. 11-24, relating to the gate formation, are for example not necessarily limited to the superlattice structures disclosed in the present figures. On the contrary, the disclosed gate formation may be applied to vertical semiconductor structures in which the source/drain and channel portions may be formed of the same material, such as for example bulk silicon. Further, the vertical semiconductor structures for the HFET devices may as well be formed of a superlattice that enables HFET devices in the form of horizontal nanowire-FETs (NWFETs) or nanosheet-FETs (NSFETs) to be produced.

What is claimed is:

1. A method of forming a semiconductor device, the method comprising:
    forming, in a vertical channel field-effect transistor (FET) device region of a semiconductor substrate, a vertical channel FET device comprising a first semiconductor structure including a lower source/drain portion, an upper source/drain portion, a first channel portion extending vertically and connecting the lower source/drain portion and the upper source/drain portion, and a first gate structure extending along the first channel portion;
    forming, in a horizontal channel FET device region of the semiconductor substrate, a horizontal channel FET device comprising a second semiconductor structure including a first source/drain portion, a second source/drain portion, a second channel portion extending horizontally and connecting the first source/drain portion and the second source/drain portion, and a second gate structure extending across the second channel portion;
    wherein forming the vertical channel FET device and forming the horizontal channel FET device comprise:
    forming, prior to forming the first gate structure and in the vertical channel FET device region, a first sacrificial gate extending along the first semiconductor structure;
    forming, prior to forming the second gate structure and in the horizontal channel FET device region, a second sacrificial gate extending across the second semiconductor structure;
    recessing the first sacrificial gate to define a gate length of the vertical channel FET device;
    embedding the first and second semiconductor structures in a dielectric layer having a height that exposes an upper surface of the second sacrificial gate;
    forming a trench in the dielectric layer to expose the first sacrificial gate of the vertical channel FET device region;
    simultaneously replacing the first sacrificial gate and the second sacrificial gate with gate structures.

2. The method of claim 1, wherein the first sacrificial gate and the second sacrificial gate are formed on an isolating layer embedding a respective bottom portion of the first and second semiconductor structures, and wherein the first sacrificial gate has an upper surface extending at a vertical level below the first channel portion of the first semiconductor structure.

3. The method of claim 1, wherein upper surfaces of the first sacrificial gate and the second sacrificial gate, prior to the recessing, are located at corresponding vertical levels in the vertical channel FET device region and in the horizontal channel FET device region.

4. The method of claim 1, wherein forming the first sacrificial gate and the second sacrificial gate comprises simultaneously patterning a sacrificial gate layer in the vertical channel FET device region and in the horizontal channel FET device region.

5. The method of claim 1, wherein the first sacrificial gate wraps around the first channel portion.

6. The method of claim 1, wherein replacing the first sacrificial gate and the second sacrificial gate with the gate structures comprises:

simultaneously etching the first sacrificial gate and the second sacrificial gate; and simultaneously depositing a first gate stack extending along the first channel portion of the first semiconductor structure and a second gate stack extending across the second channel portion of the second semiconductor structure.

7. The method of claim 6, further comprising recessing the first gate stack deposited in the trench in the vertical channel FET device region.

8. The method of claim 1, further comprising, prior to forming the first sacrificial gate in the vertical channel FET device region, forming a spacer on peripheral surfaces of the upper source/drain portion and the lower source/drain portion of the first semiconductor structure.

9. The method of claim 8, wherein forming the spacer comprises subjecting the first semiconductor structure to an oxidation process, thereby forming an oxide layer on the peripheral surfaces of the upper source/drain portion, the lower source/drain portion and on a peripheral surface of the first channel portion, such that the upper source/drain portion and the lower source/drain portion are provided with thicker oxide layer portions than the first channel portion.

10. The method of claim 9, further comprising etching the oxide layer on the first channel portion to expose the first channel portion while preserving at least some of the oxide layer on the upper source/drain portion and the lower source/drain portion.

11. The method of claim 1, wherein the lower source/drain portion comprises $Si_{1-x}Ge_x$, the first channel portion comprises $Si_{1-y}Ge_y$, and the upper source/drain portion comprises $Si_{1-z}Ge_z$, wherein $0<x$, $z\leq1$ and $0\leq y<x$, z.

12. The method of claim 11, wherein the first channel portion has a lower Ge content than the lower source/drain portion and the upper source/drain portion.

13. The method of claim 11, wherein the first channel portion consists essentially of Si.

14. The method of claim 11, wherein the upper source/drain portion and the lower source/drain portion comprise a Ge content of 10% to 90%.

15. The method of claim 11, wherein the upper source/drain portion and the lower source/drain portion comprise a Ge content of 20 to 30%.

16. The method of claim 1, further comprising, prior to forming the vertical channel FET device and the horizontal channel FET device:

forming, in the vertical channel FET device region, a first layer structure comprising, in the following order, a lower semiconductor layer for forming the lower source/drain portion, an intermediate semiconductor layer for forming the first channel portion, and an upper semiconductor layer for forming the upper source/drain portion, and forming, in the horizontal channel FET device region, a second layer structure comprising at least one semiconductor layer, wherein a surface of the semiconductor substrate in the vertical channel FET device region is coplanar with a surface of the semiconductor substrate in the horizontal channel FET device region;

forming a mask defining a first semiconductor structure mask portion above the vertical channel FET device region and a second semiconductor structure mask portion above the horizontal channel FET device region; and patterning the first layer structure and the second layer structure by simultaneously etching the first layer structure and the second layer structure while using the mask as an etch mask, thereby forming:

the first semiconductor structure for the vertical channel FET device in the vertical channel FET device region, and the second semiconductor structure for the horizontal channel FET device in the horizontal channel FET device region.

17. The method of claim 16, wherein simultaneously etching comprises etching back exposed surface portions of the first layer structure and the second layer structure to a common vertical level, such that the first semiconductor structure and second semiconductor structure present corresponding heights above the common vertical level.

18. The method of claim 16, wherein forming the first layer structure comprises:

recessing the semiconductor substrate in the vertical channel FET device region; and subsequent to recessing, epitaxially growing the first layer structure comprising the lower semiconductor layer, the intermediate semiconductor layer, and the upper semiconductor layer such that an upper surface of the first layer structure is coplanar with the surface of the substrate in the horizontal channel FET device region.

19. The method of claim 18, further comprising, prior to epitaxially growing the first layer structure, forming an insulating layer on a sidewall of at least one semiconductor layer.

* * * * *